US012520532B2

(12) United States Patent
Lee et al.

(10) Patent No.: US 12,520,532 B2
(45) Date of Patent: Jan. 6, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shen-Yang Lee, Hsinchu (TW); Hsiang-Pi Chang, Hsinchu (TW); Huang-Lin Chao, Hsinchu (TW); Pinyen Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 373 days.

(21) Appl. No.: 18/313,611

(22) Filed: May 8, 2023

(65) Prior Publication Data
US 2024/0379793 A1 Nov. 14, 2024

(51) Int. Cl.
*H01L 29/423* (2006.01)
*H01L 21/324* (2006.01)
*H01L 29/06* (2006.01)
*H01L 29/66* (2006.01)
*H10D 30/01* (2025.01)
*H10D 30/67* (2025.01)
*H10D 62/10* (2025.01)
*H10D 64/01* (2025.01)

(52) U.S. Cl.
CPC ....... *H10D 30/6735* (2025.01); *H01L 21/324* (2013.01); *H10D 30/014* (2025.01); *H10D 62/121* (2025.01); *H10D 64/017* (2025.01)

(58) Field of Classification Search
CPC ............. H10D 30/6735; H10D 30/014; H10D 62/121; H10D 64/017; H01L 21/324
See application file for complete search history.

(56) References Cited

U.S. PATENT DOCUMENTS 10,770,563 B2 * 9/2020 Cheng ............... H01L 21/28194
2005/0231270 A1 10/2005 Washburn
(Continued)

FOREIGN PATENT DOCUMENTS

| TW | 200941184 A | 10/2009 |
|---|---|---|
| TW | 201135397 A | 10/2011 |
| TW | 201144971 A | 12/2011 |

OTHER PUBLICATIONS

Office Action issued in connection with Taiwan Appl. No. 112126800 dated May 27, 2024.

*Primary Examiner* — Tracie Y Green
(74) *Attorney, Agent, or Firm* — FOLEY & LARDNER LLP

(57) ABSTRACT

A method for fabricating a semiconductor device includes exposing one or more surfaces of a conduction channel of a transistor; overlaying the one or more surfaces with a dielectric interfacial layer; overlaying the dielectric interfacial layer with a blocking layer;
performing a first annealing process to densify the dielectric interfacial layer; overlaying the blocking layer with a first high-k dielectric layer; forming one or more threshold voltage modulation layers over the first high-k dielectric layer; performing a second annealing process to adjust a doping profile of the first high-k dielectric layer; and overlaying the first high-k dielectric layer with a second high-k dielectric layer.

20 Claims, 24 Drawing Sheets

(56) References Cited

U.S. PATENT DOCUMENTS

| | | | |
|---|---|---|---|
| 2017/0133278 A1* | 5/2017 | Bao | H10D 84/038 |
| 2020/0395216 A1* | 12/2020 | Kelly | H10D 84/038 |
| 2021/0041928 A1 | 2/2021 | Eberlein | |
| 2023/0162983 A1* | 5/2023 | Savant | H01L 21/28185 |
| | | | 257/407 |
| 2023/0299085 A1* | 9/2023 | Xie | H10D 88/01 |
| | | | 257/351 |
| 2024/0304667 A1* | 9/2024 | Chao | H10D 64/017 |
| 2024/0387639 A1* | 11/2024 | Liao | H10D 84/85 |

* cited by examiner

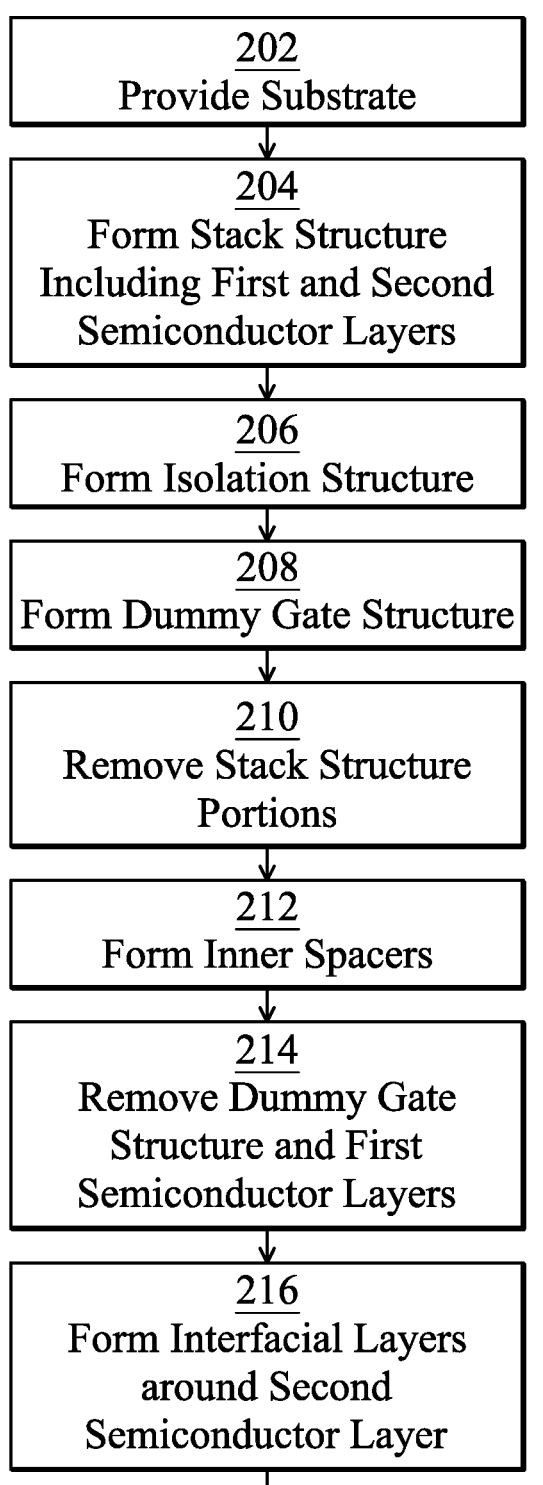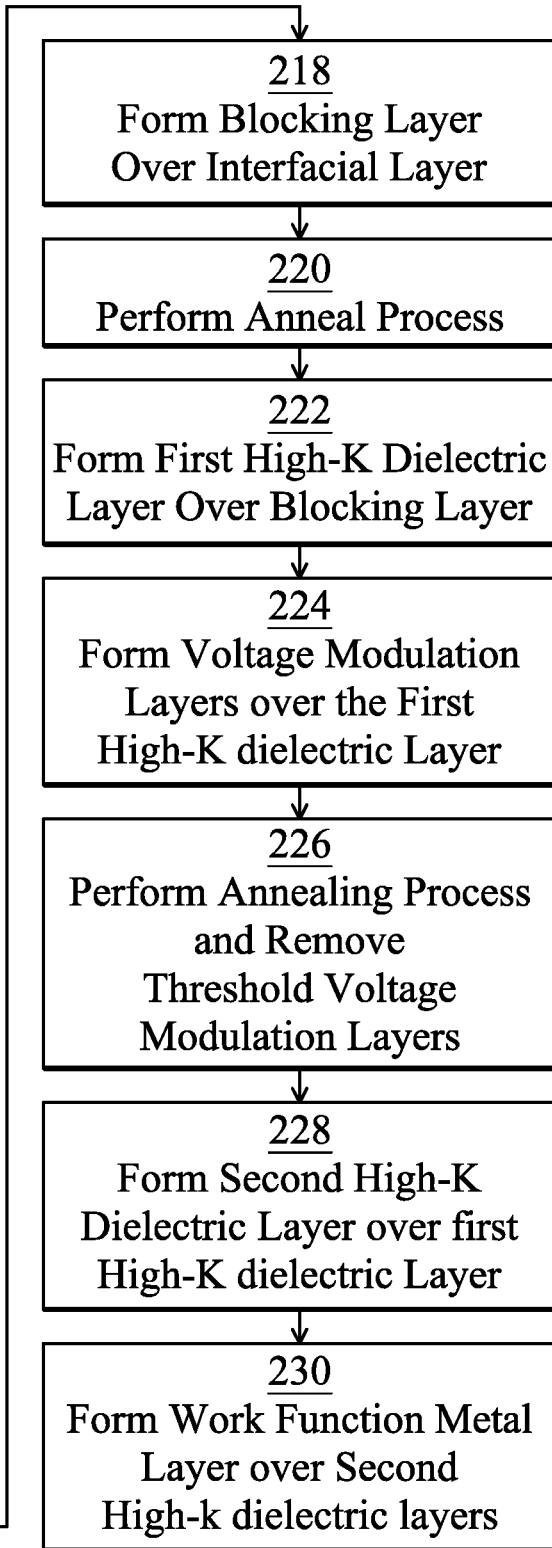
FIG. 2

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates a flow chart of an example method for making a non-planar transistor device, in accordance with some embodiments.

FIGS. 18, 19, 20, 21, 22, 23, 24, 25, 26, 27, 28, 29, 30, and 31 illustrate cross-sectional views of a number of example GAA FET devices during various fabrication stages, made based on the method of FIG. 2, in accordance with some embodiments.

DETAILED DESCRIPTION

Figure 1:
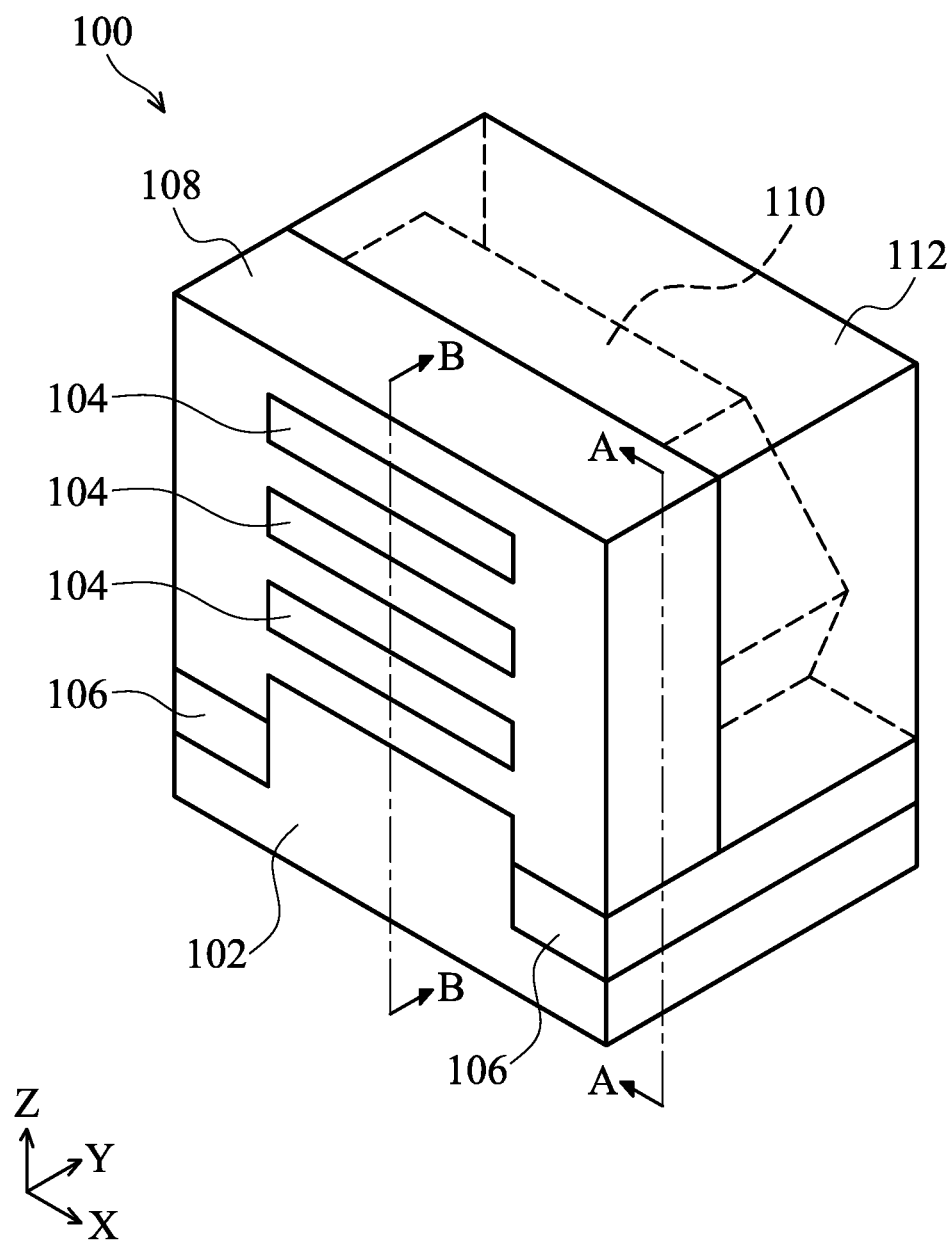
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with continuing advance to the next generation of transistor architectures, the dimensions of a single transistor have become increasingly smaller. The dimensions of various features and/or spacing between adjacent features of a transistor have become smaller, which can significantly make processes of the transistor challenging. For example, a transistor using multiple nanostructures (e.g., nanosheets) as its conduction channel has been proposed as the next generation transistor architecture. In such an architecture, the spacing between adjacent nanostructures is typically smaller, which makes forming a gate structure with adequate quality to wrap around each of the nanostructures difficult. When forming the gate structure, which typically includes at least one high-k dielectric layer and at least one metal layer, oxygen can migrate into the interfacial layer, or the interfacial layer can undergo growth, diffusion, or otherwise receive defects, which may increase a capacitive-equivalent-thickness corresponding to the effective oxide thickness. According to some approaches, a scaled interfacial layer thickness or high-k material thickness can be reduced to reduce a maximum thickness upon regrowth of the interfacial layer. However, large leakage currents can traverse any remaining thinner portions. A metal gate (e.g., titanium) can scavenge oxygen atoms from the interfacial layer, through such scavenging can leave behind defects in the interfacial layer such as trap states. Moreover, many existing approaches can significantly complicate the process of forming a transistor. Thus, the existing technologies for forming transistors have not been entirely satisfactory in some aspects.

Embodiments of the present disclosure are discussed in the context of forming a nanostructure field-effect-transistor (FET) device (sometimes referred to as a gate-all-around (GAA) FET device, or a fork sheet structure), and in particular, in the context of forming a replacement gate of a GAA FET device. For example, in some aspects of the present disclosure, a blocking layer is formed over the interfacial layer, such as by an atomic layer deposition process. In some embodiments, the blocking layer can be formed from a thermally stable high-k material covering the interfacial layer. Further high-k layers can be formed over the blocking layer, at least one of which can be doped (e.g., via drive-in annealing) to tune a $V_T$. Further, in some aspects of the present disclosure, a work function metal layer can be formed over the high-k materials to form a metal gate of the GAA FET device.

FIG. 1 illustrates a perspective view of an example nanostructure transistor device (e.g., a GAA FET device) 100, in accordance with various embodiments. The GAA FET device 100 includes a substrate 102 and a number of nanostructures (e.g., nanosheets, nanowires, etc.) 104 above the substrate 102. The nanostructures 104 are vertically separated from one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. An interlayer dielectric (ILD) 112 is disposed over the source/drain structure 110.

It should be appreciated that FIG. 1 depicts a simplified GAA FET device, and thus, one or more features of a completed GAA FET device may not be shown in FIG. 1.

For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108 (e.g., in the X direction); and cross-section B-B is cut along a longitudinal axis of one of the nanostructures 104 and in a direction of a current flow between the source/drain structures (e.g., in the Y direction). Subsequent figures may refer to these reference cross-sections for clarity.

FIG. 2 illustrates a flowchart of a method 200 to form a nanostructure transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, at least a portion of a complementary field-effect-transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4, 5, 6, 7, 8, 9, 10, 11, 12, 13, 14, 15, 16, and 17 respectively, which will be discussed in further detail below.

In brief overview, the method 200 starts with operation 202 of providing a substrate. The method 200 continues to operation 204 of forming a stack structure including a number of first semiconductor layers and a number of second semiconductor layers. The method 200 continues to operation 206 of forming an isolation structure. The method 200 continues to operation 208 of forming a dummy gate structure. The method 200 continues to operation 210 of removing portions of the stack structure. The method 200 continues to operation 212 of forming inner spacers. The method 200 continues to operation 214 of removing the dummy gate structure and the first semiconductor layers. The method 200 continues to operation 216 of forming an interfacial layer wrapping around each of the second semiconductor layers. The method 200 continues to operation 218 of forming a blocking layer over the interfacial layer. The method 200 continues to operation 220 of performing an annealing process. The method 200 continues to operation 222 of forming a first high-k dielectric layer over the blocking layer. The method 200 continues to operation 224 of forming one or more threshold voltage modulation layers over the first high-k dielectric layer. The method 200 continues to operation 226 of performing an annealing process and removing the one or more threshold voltage modulation layers. The method 200 continues to operation 228 of forming a second high-k dielectric layer over the first high-k dielectric layer. The method 200 continues to operation 230 of forming one or more work function metal layers over the second high-k dielectric layer to form an active gate structure.

As mentioned above, FIGS. 3-17 each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Figure 3:
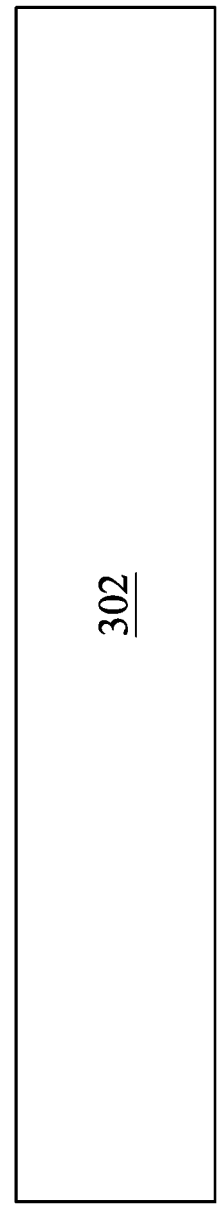
FIGS. 3, 4, 5, 6, 7, 8, 9, 10, 11, 12, 13, 14, 15, 16, and 17 illustrate cross-sectional views of an example GAA FET device (or a portion of the example GAA FET device) during various fabrication stages, made by the method of FIG. 2, in accordance with some embodiments.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction perpendicular to the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
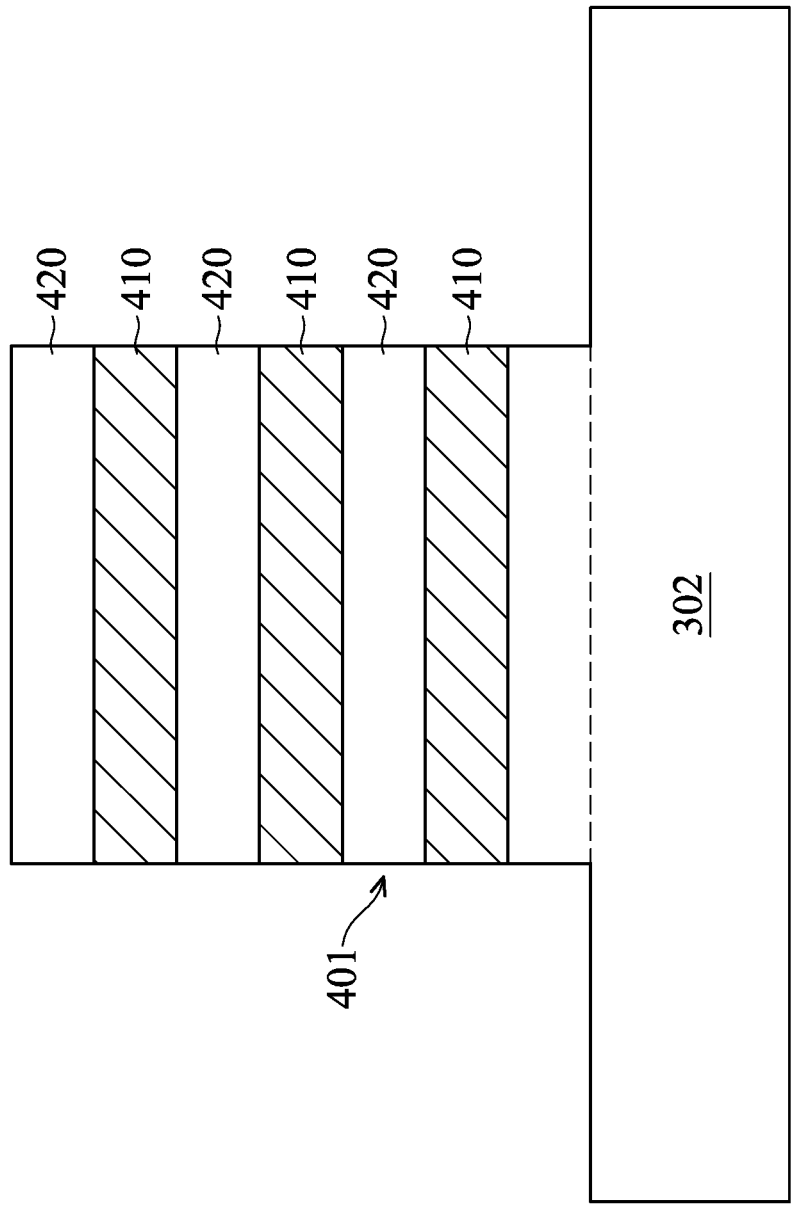

Corresponding to operation 204 of FIG. 2, FIG. 4 is a cross-sectional view of the GAA FET device 300 including a number of first semiconductor layers 410 and a number of second semiconductor layers 420 formed on the substrate 302 at one of the various stages of fabrication. The cross-sectional view of FIG. 4 is cut in a direction perpendicular to the lengthwise direction of an active/dummy gate structure of the GAA FET device 300 (e.g., cross-section A-A indicated in FIG. 1).

As shown, the first semiconductor layers 410 and the second semiconductor layers 420 are alternatingly disposed on top of one another (e.g., along the Z direction) to form a stack. For example, one of the second semiconductor layers 420 is disposed over one of the first semiconductor layers 410 then another one of the first semiconductor layers 410 is disposed over the second semiconductor layer 420, so on and so forth. The stack may include any number of alternately disposed first and second semiconductor layers 410 and 420, respectively. For example in FIG. 4, the first stack includes 3 first semiconductor layers 410, with 3 second semiconductor layers 420 alternatingly disposed therebetween and with one of the second semiconductor layers 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm (e.g., between about 5 nm and about 8 nm), and each of the second semiconductor layers 420 has a thickness ranging from about 5 nm to about 20 nm (e.g., between about 5 nm and about 8 nm). Sheet to sheet spacing (e.g., for a same sheet type) can be greater than 8 nm. For example, sheet to sheet spacing can be between about 8 nm and about 12 nm. Lateral dimensions of the stacks can be less than about 50 nm along at least one lateral dimension (e.g., between about 15 nm and 50 nm).

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 420 (e.g., of silicon). In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302 (as a stack), the stack may be patterned to form one or more stack structures (e.g., 401). Each of the stack structures is elongated along a lateral direction (e.g., the Y direction), and includes a stack of patterned semiconductor layers 410-420 interleaved with each other. The stack structure 401 is formed by patterning the semiconductor layers 410-420 and the semiconductor substrate 302 using, for example, photolithography and etching techniques. For example, a mask layer (which can include multiple layers such as, for example, a pad oxide layer and an overlying pad nitride layer) is formed over the topmost semiconductor layer (e.g., 420 in FIG. 4). The pad oxide layer may be a thin film comprising silicon oxide formed, for example, using a thermal oxidation process. The pad oxide layer may act as an adhesion layer between the topmost semiconductor layer 410 (or the semiconductor layer 420 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form trenches (or openings), thereby defining the stack structures 401 between adjacent trenches. When multiple stack structures are formed, such a trench may be disposed between any adjacent ones of the stack structures. In some embodiments, the stack structure 401 is formed by etching trenches in the semiconductor layers 410-420 and substrate 302 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the stack structure 401.

Figure 5:
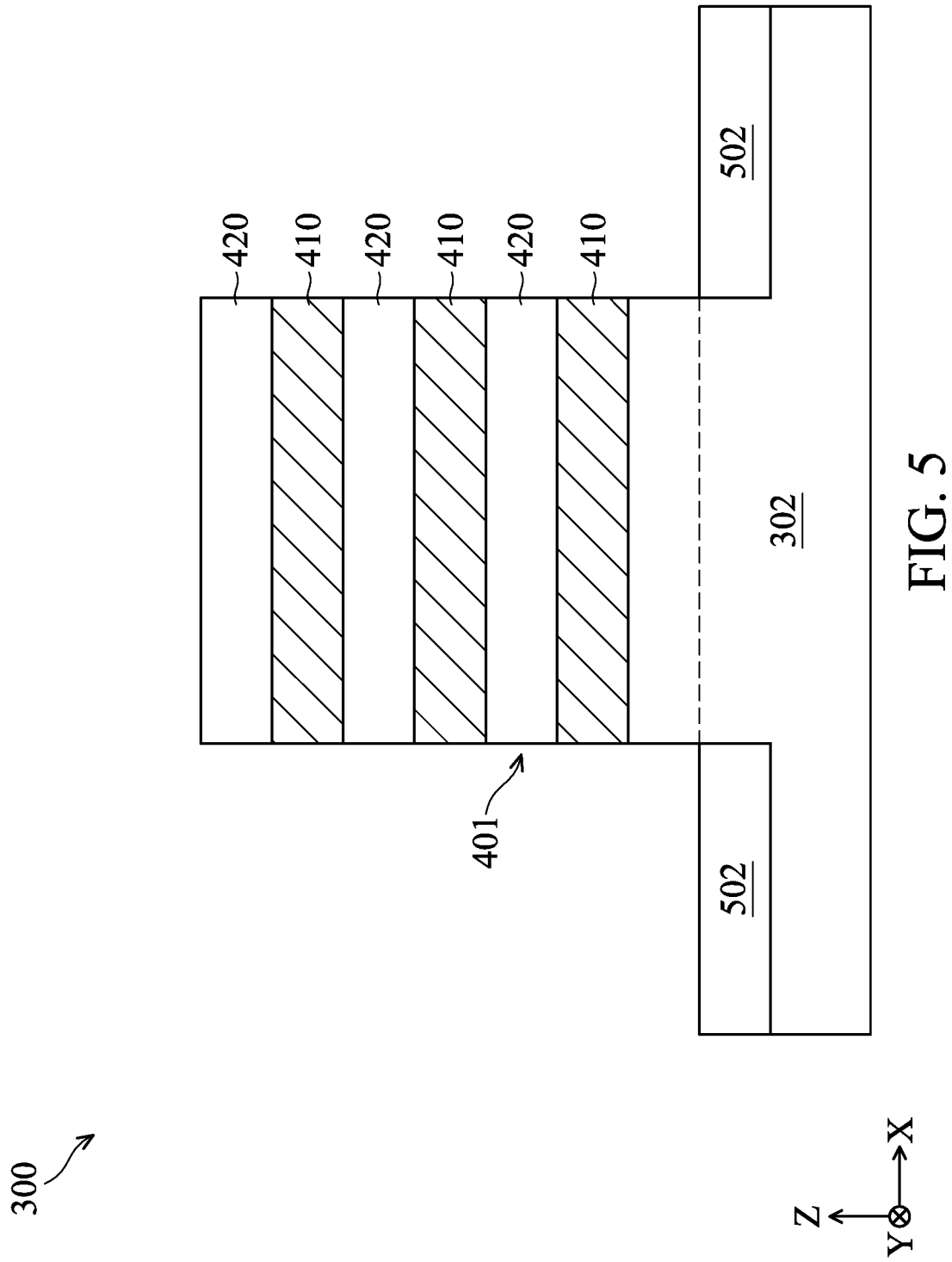

Corresponding to operation 206 of FIG. 2, FIG. 5 is a cross-sectional view of the GAA FET device 300 including one or more isolation structures 502, at one of the various stages of fabrication. The cross-sectional view of FIG. 5 is cut in a direction perpendicular to the lengthwise direction of an active/dummy gate structure of the GAA FET device 300 (e.g., cross-section A-A indicated in FIG. 1).

The isolation structure 502, which can includes multiple portions, may be formed between adjacent stack structures, or next to a single stack structure. The isolation structure 502, which are formed of an insulation material, can electrically isolate neighboring stack structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the stack structure 401. The patterned mask may also be removed by the planarization process, in various embodiments.

Next, the insulation material is recessed to form the isolation structure 502, as shown in FIG. 5, which is sometimes referred to as a shallow trench isolation (STI).

The isolation structure 502 is recessed such that the stack structure 401 protrudes from between neighboring portions of the isolation structure 502. The top surface of the isolation structures (STIs) 502 may have a flat surface (as illustrated), a convex surface, a concave surface (such as dishing), or combinations thereof. The top surface of the isolation structure 502 may be formed flat, convex, and/or concave by an appropriate etch. The isolation structure 502 may be recessed using an acceptable etching process, such as one that is selective to the material of the isolation structure 502. For example, a dry etch or a wet etch using dilute hydrofluoric (DHF) acid may be performed to recess the isolation structure 502.

Figure 6:
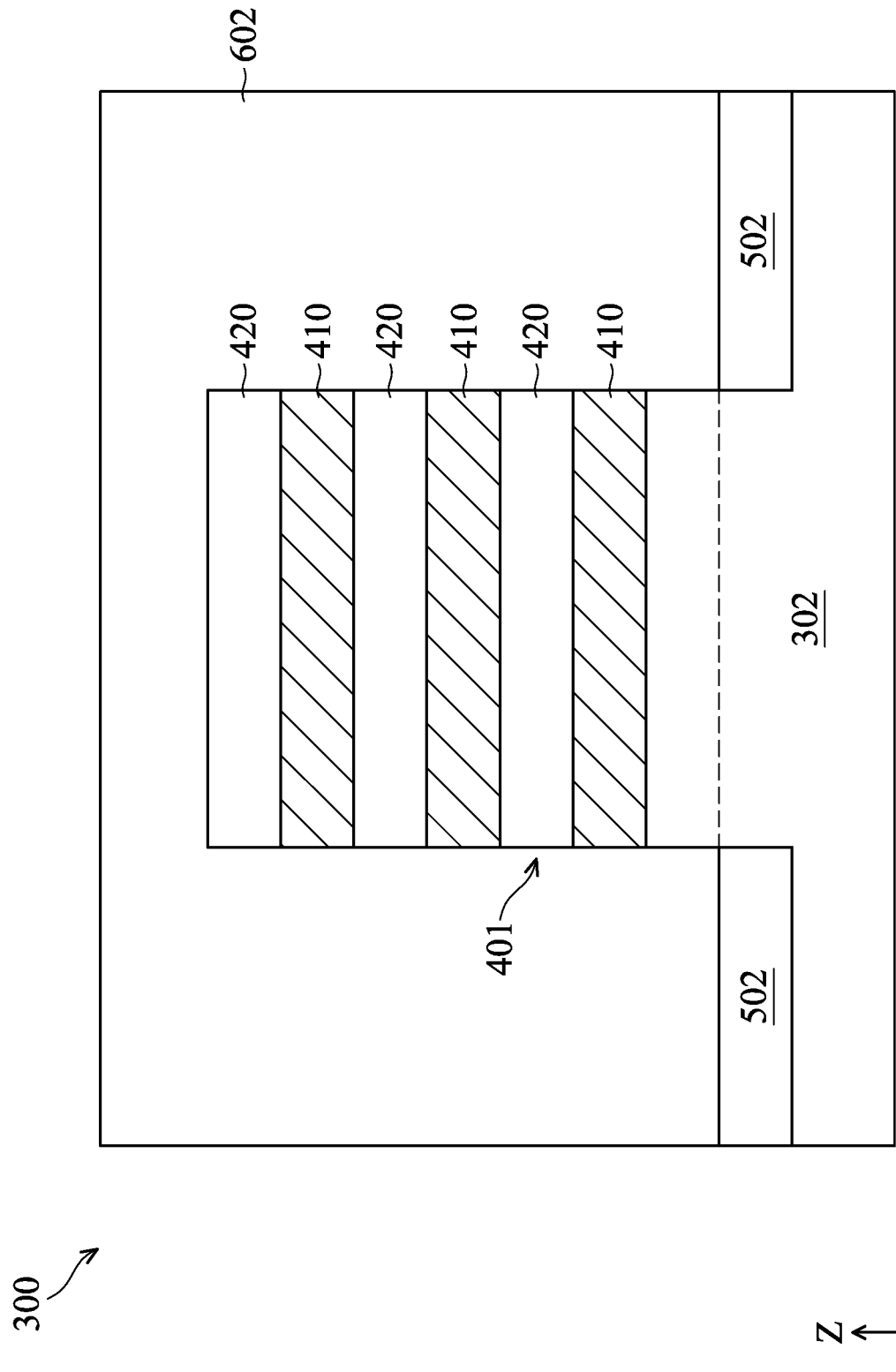

Corresponding to operation 208 of FIG. 2, FIG. 6 is a cross-sectional view of the GAA FET device 300 including a dummy gate structure 602, at one of the various stages of fabrication. The cross-sectional view of FIG. 6 is cut in a direction perpendicular to the lengthwise direction of an active/dummy gate structure of the GAA FET device 300 (e.g., cross-section A-A indicated in FIG. 1).

Next, the dummy gate structure 602 is formed over the stack structure 401 and the isolation structure 502. The dummy gate structure 602 can extend along a lateral direction (e.g., the X direction) perpendicular to the lengthwise direction of the stack structure 401. The dummy gate structure 602 may be formed in a place where an active (e.g., metal) gate structure is later formed, i.e., defining a footprint of the active gate structure, in various embodiments. In some embodiments, the dummy gate structure 602 is placed over a portion of stack structure 401. Such an overlaid portion of the stack structure 401, which includes portions of the second semiconductor layers 420 that are collectively configured as a conduction channel and portions of the first semiconductor layers 410 that are replaced with an active gate structure. As such, the active gate structure can wrap around each of the portions of the second semiconductor layers 420, which will be discussed in further detail below.

In some embodiments, the dummy gate structure 602 can include one or more Si-based or SiGe-based materials that are similar (or having similar etching rates) as the first semiconductor layers 410 such as, for example, SiGe. The dummy gate structure 602 may be deposited by CVD, PECVD, ALD, FCVD, or combinations thereof. Although the dummy gate structure 602 is shown as being formed as a single-piece in the illustrated embodiment of FIG. 6, it should be understood that the dummy gate structure 602 can be formed to have multiple portions, each of which may include respective different materials.

Figure 7:
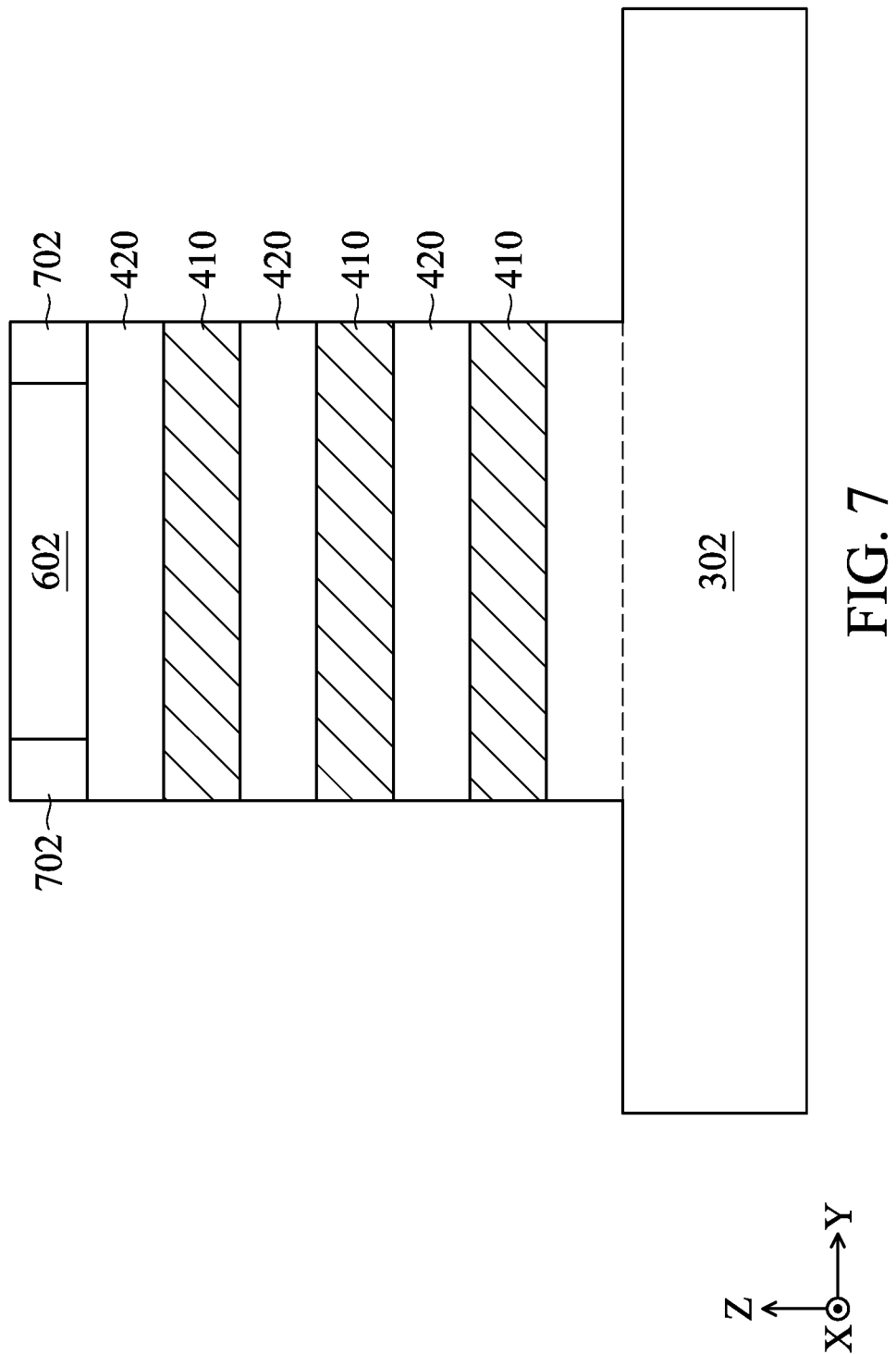

Corresponding to operation 210 of FIG. 2, FIG. 7 is a cross-sectional view of the GAA FET device 300 in which portions of the stack structure 401 that are not overlaid by the dummy gate structure 602 are removed, at one of the various stages of fabrication. The cross-sectional view of FIG. 7 is cut in the lengthwise direction of a stack structure of the GAA FET device 300 (e.g., cross-section B-B indicated in FIG. 1).

After forming the dummy gate structure 602, a pair of gate spacers 702 can be formed to extend along opposite sidewalls of the dummy gate structure 602 (in the Y direction). The gate spacers 702 may include a low-k dielectric material and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 702. The dummy gate structure 602, together with the gate spacers 702, can serve as a mask to etch the non-overlaid portions of the stack structure 401, which results in the stack structure 401 having one or more alternatingly stacks including remaining portions of the semiconductor layers 410 and 420. As a result, along the Z direction, newly formed sidewalls of each of the stack structures 401 are aligned with sidewalls of the dummy gate structure 602. For example in FIG. 7, semiconductor layers 410 and 420 are the remaining portions of the semiconductor layers 410 and 420 overlaid by the dummy gate structure 602, respectively. In some embodiments, the semiconductor layers 410 and 420 may sometimes be referred to as nanostructures (e.g., nanosheets) 410 and 420, respectively.

Figure 8:
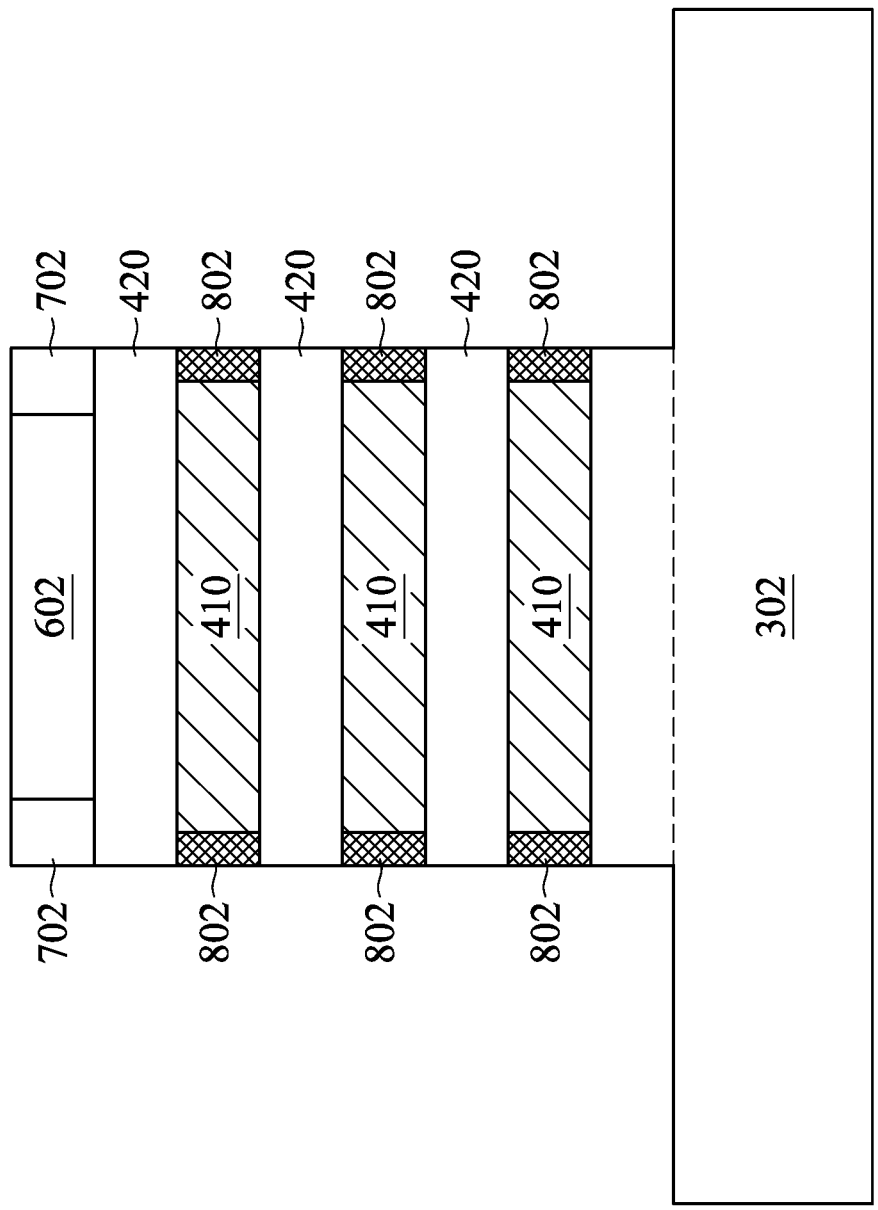

Corresponding to operation 212 of FIG. 2, FIG. 8 is a cross-sectional view of the GAA FET device 300 including a number of inner spacers 802, at one of the various stages of fabrication. The cross-sectional view of FIG. 8 is cut in the lengthwise direction of a stack structure of the GAA FET device 300 (e.g., cross-section B-B indicated in FIG. 1).

To form the inner spacers 802, respective end portions of each of the nanostructures 410 are removed. The end portions of the nanostructures 410 can be removed (e.g., etched) using a "pull-back" process to pull the nanostructures 410 back by a pull-back distance. In an example where the semiconductor layers 420 include Si, and the semiconductor layers 410 include SiGe, the pull-back process may include a hydrogen chloride (HCl) gas isotropic etch process, which etches SiGe without attacking Si. As such, the Si layers (nanostructures) 420 may remain intact during this process. Consequently, a number of pairs of recesses can be formed. These recesses are then filled with a dielectric material to form the inner spacers 802. As shown in FIG. 8, each pair of the inner spacers 802 are formed along respective etched ends of the nanostructures 410.

In some embodiments, the inner spacer 802 can be formed conformally by chemical vapor deposition (CVD), or by monolayer doping (MLD) of nitride followed by spacer RIE. The inner spacer 802 can be deposited using, e.g., a conformal deposition process and subsequent isotropic or anisotropic etch back to remove excess spacer material on the sidewalls of the stacks of the stack structure 401 and on a surface of the semiconductor substrate 302. The inner spacer 802 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 9:
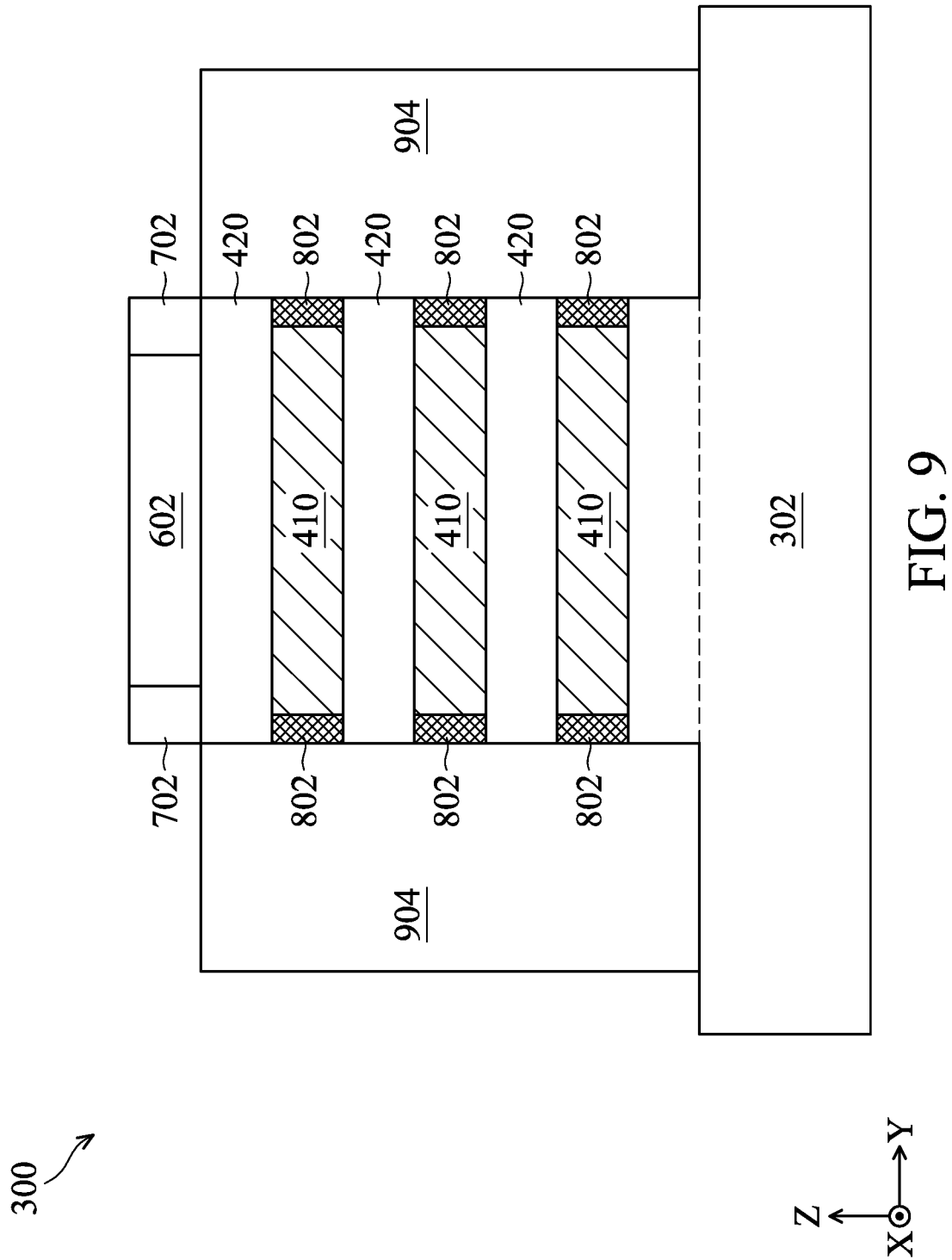

Corresponding to operation 214 of FIG. 2, FIG. 9 is a cross-sectional view of the GAA FET device 300 in which a pair of epitaxial structures 904 are formed along the ends of each of the nanostructures 420 (along the Y direction). The cross-sectional view of FIG. 9 is cut in the lengthwise direction of a stack structure of the GAA FET device 300 (e.g., cross-section B-B indicated in FIG. 1).

A pair of epitaxial structures 904 may be formed to couple to respective ends of each of the nanostructures 420 (along the Y direction). Further, the epitaxial structures 904 are separated (or otherwise isolated) from respective ends (along the Y direction) of the nanostructures 410 of FIG. 7 with the inner spacers 802.

The epitaxial structures 904 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), any other suitable material, or combinations thereof. The epitaxial structures 904 may be formed using an epitaxial layer growth process on exposed ends of each of the nanostructures 420. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes. In-situ doping (ISD) may be applied to form doped epitaxial structures 904, thereby creating the junctions for the GAA FET device 300. For example, when the GAA FET device 300 is configured in n-type, the epitaxial structures 904 can be doped by implanting n-type dopants, e.g., arsenic (As), phosphorous (P), etc., into them. When the GAA FET device 300 is configured in p-type, the epitaxial structures 904 can be doped by implanting p-type dopants, e.g., boron (B), etc., into them.

Figure 10:
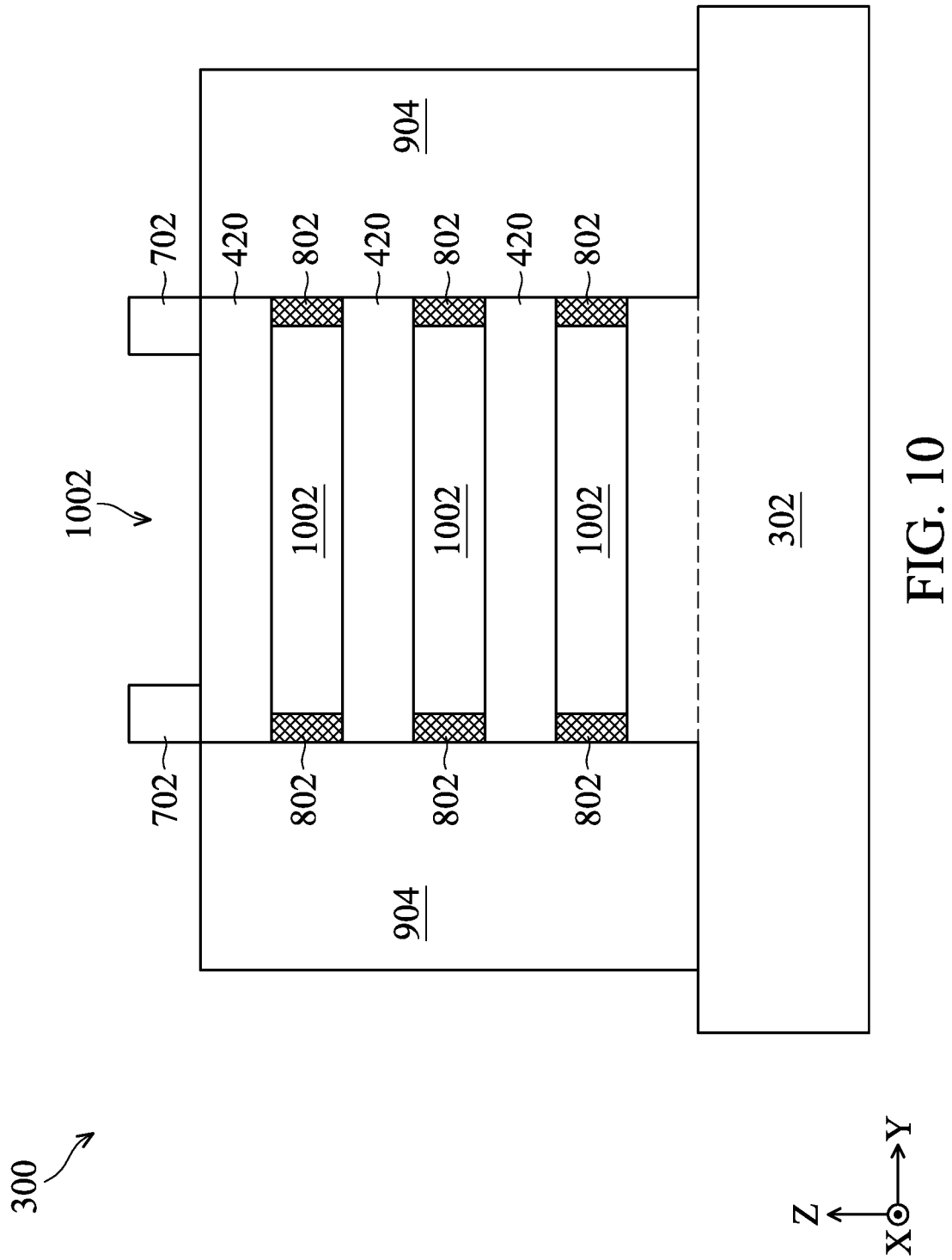

With continued correspondence to operation 214 of FIG. 2, FIG. 10 is a cross-sectional view of the GAA FET device 300 in which the dummy gate structure 602 and the remaining portions of the nanostructures 410 are removed so as to form a gate trench 1002, at one of the various stages of fabrication. The cross-sectional view of FIG. 10 is cut in the lengthwise direction of a stack structure of the GAA FET device 300 (e.g., cross-section B-B indicated in FIG. 1).

Following the formation of the epitaxial structures 904, the dummy gate structure 602 and the nanostructures 410 depicted in, for example, FIG. 7, may be collectively or respectively removed to form the gate trench 1002. In some embodiments, the dummy gate structure 602 and/or the nanostructures 410 can be removed by applying a selective etch (e.g., a hydrochloric acid (HCl)), while leaving the nanostructures 420, the gate spacers 702, and inner spacers 802 substantially intact. After the removal of the dummy gate structure 602, a portion of the gate trench 1002, exposing respective sidewalls of each of the nanostructures 420 that face the X direction, may be formed. After the removal of the nanostructures 410 to further extend the gate trench 1002, respective bottom surface and/or top surface of each of the nanostructures 420 may be exposed. Consequently, a full circumference of each of the nanostructures 420 can be exposed.

Figure 11:
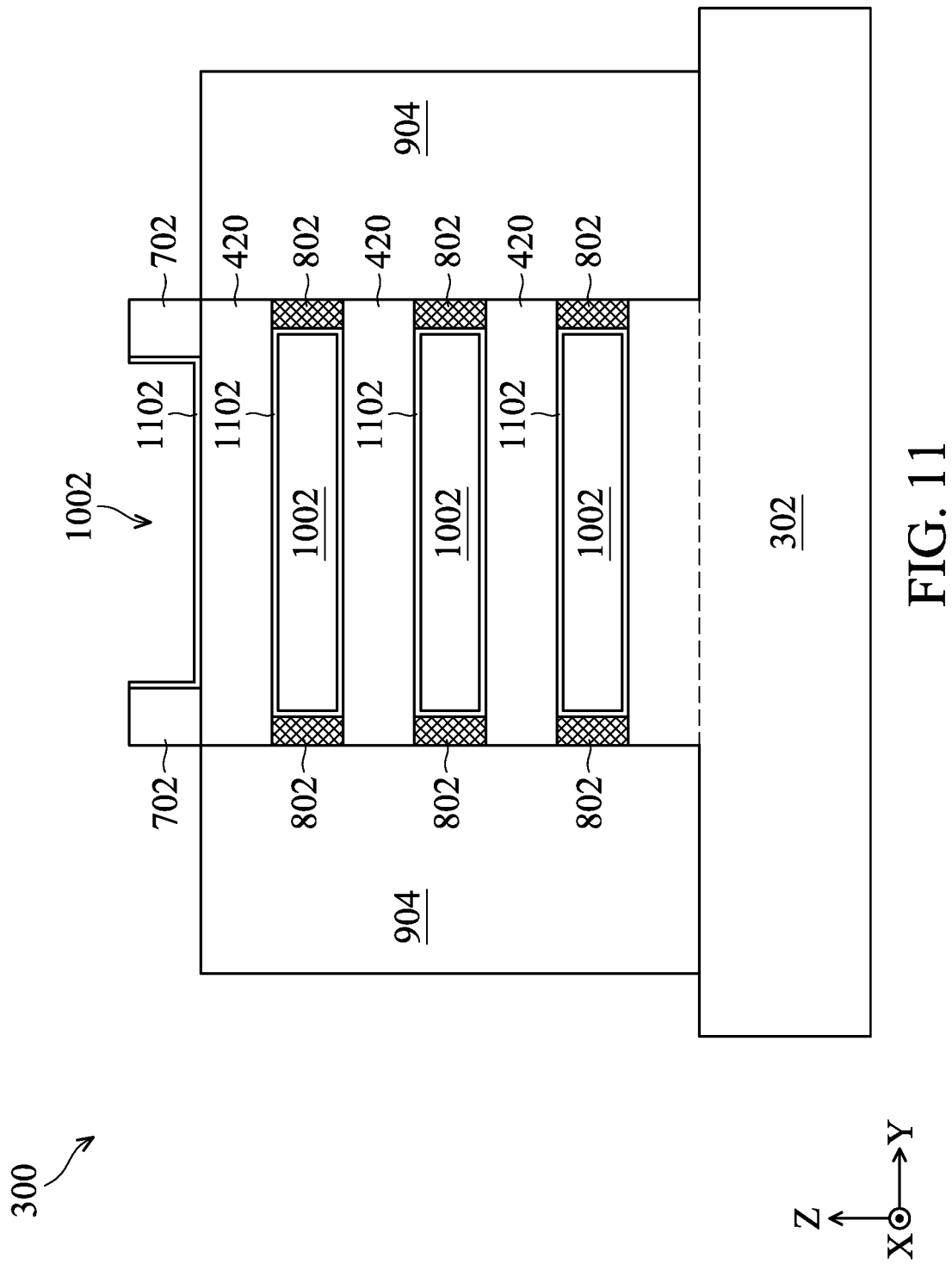

Corresponding to operation 216 of FIG. 2, FIG. 11 is a cross-sectional view of the GAA FET device 300 including an interfacial layer 1102 formed to wrap around each of the nanostructures 420, at one of the various stages of fabrication. The cross-sectional view of FIG. 11 is cut in the lengthwise direction of a stack structure of the GAA FET device 300 (e.g., cross-section B-B indicated in FIG. 1).

As shown in the cross-sectional view of FIG. 11, the interfacial layer 1102 is formed within each portion of the gate trench 1002. Specifically, the interfacial layer 1102 may wrap around the circumference of each of the nanostructures 420. The interfacial layer 1102 may include silicon, oxygen, and/or nitrogen. In an embodiment, the interfacial layer 1102 may include $SiO_2$. The interfacial layer 1102 may be formed by performing a wet etching process. The wet etching process can include applying a heated chemical mixture on the one or more surfaces of the conduction channel. For example, the chemical mixture can include ammonium hydroxide (NH4OH), hydrogen chloride (HCl), sulfuric acid (H2SO4), or hydrogen peroxide (H2O2). The interfacial layer 1102 may thereafter form based on interactions with an environment (e.g., a silicon substrate can combine with atmospheric oxygen to form a $SiO_2$ interfacial layer 1102). The interfacial layer 1102 can be less than about 1 nm. For example, the interfacial layer 1102 can equal to or less than 5 angstroms (Å), as originally formed.

Figure 12:
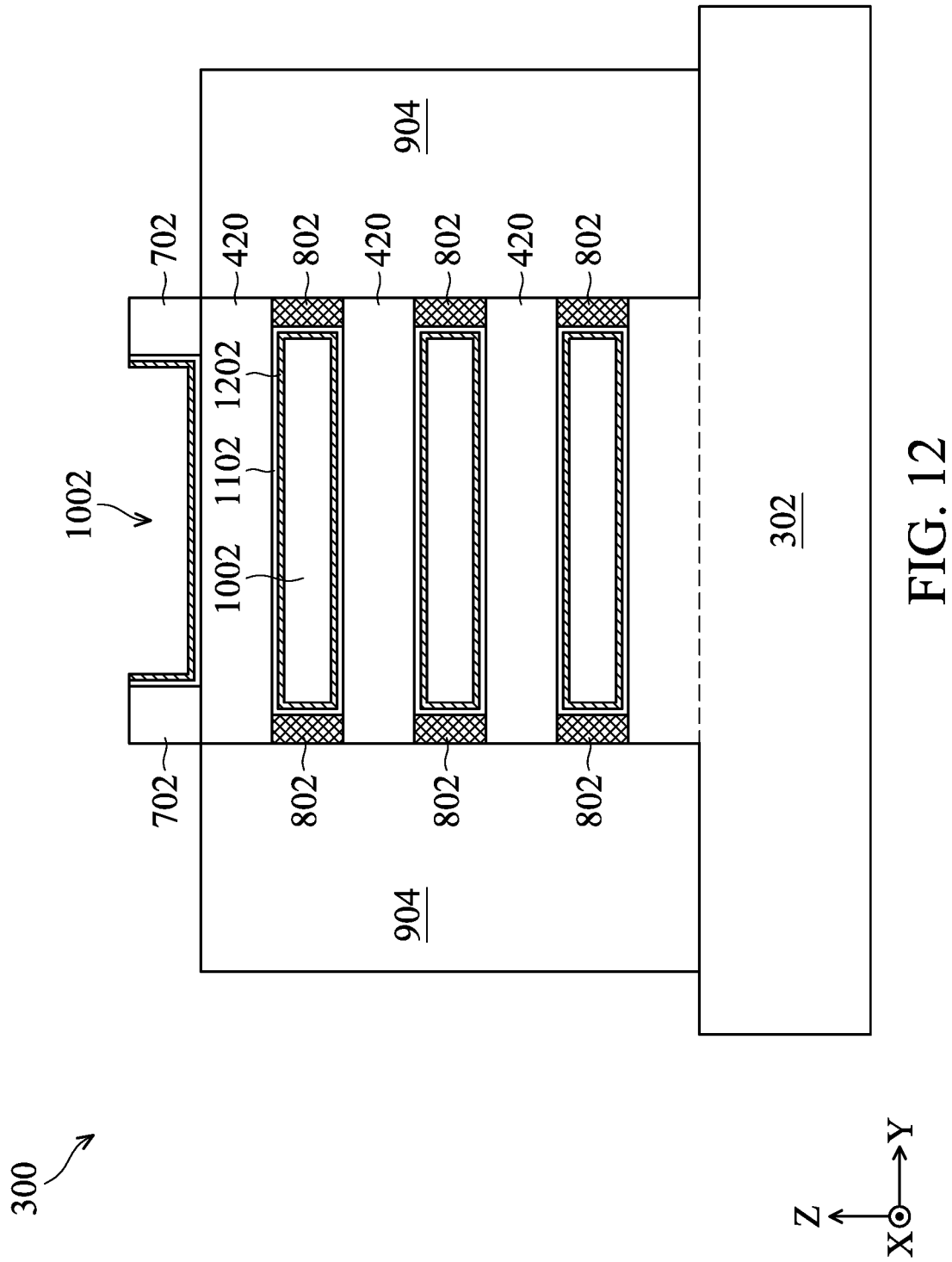

Corresponding to operation 218 of FIG. 2, FIG. 12 is a cross-sectional view of the GAA FET device 300 including a blocking layer 1202 formed over the interfacial layer 1102, at one of the various stages of fabrication. The cross-sectional view of FIG. 12 is cut in the lengthwise direction of a stack structure of the GAA FET device 300 (e.g., cross-section B-B indicated in FIG. 1).

The blocking layer 1202 can be formed from a thermally stable material, which may include high-k materials. For example, the blocking layer can be or include a (metal) oxide or a silicate of aluminum, scandium, yttrium, lutetium, thulium, gadolinium, erbium, Magnesium, calcium, Zirconium, or the like. The material of the blocking layer 1202 can be selected to interface with the interfacial layer (e.g., $SiO_2$), based on a dielectric constant thereof (e.g., be a high-k material, having a k value greater than the interfacial layer 1102), or to interface with the first high-k layer, which is further described with regard to FIG. 13. For example, the blocking layer can resist diffusion or other interactions with the interfacial layer 1102 and the later formed first high-k layer at elevated temperatures (e.g., during an annealing process of operation 220 or 226). The blocking layer can be formed by an ALD process. The blocking layer thickness can be less than about 10 nm. For example, the blocking layer thickness can be between 5 nm and 8 nm. By serving as a part of the gate dielectric layer of the GAA FET device 300, the blocking layer thickness can reduce a capacitive-equivalent-thickness of the device. For example, the blocking layer can reduce a regrowth of the interfacial layer 1102, while maintaining a minimum distance which can reduce a leakage (e.g., tunneling), relative to thinned interfacial layers 1102.

Corresponding to operation 220, with continuing reference, to FIG. 12, an anneal process can be performed on the GAA FET device 300. In some embodiments, the post deposition anneal can be applied, to correct surface defects in the blocking layer 1202, or densify the interfacial layer 1102. For example, the GAA FET device 300 can be annealed subsequent to the deposition of the blocking layer 1202 and prior to the annealing of operation 226. The annealing of the blocking layer can be below a recrystallization temperature of the blocking layer 1202. For example, the annealing can be at less than about 900° C. or less than about 800° C. For example, the anneal process can be a rapid anneal process between about 10 seconds and about 30 seconds between about 600° C. and about 700° C. In some embodiments, such an anneal is omitted.

Figure 13:
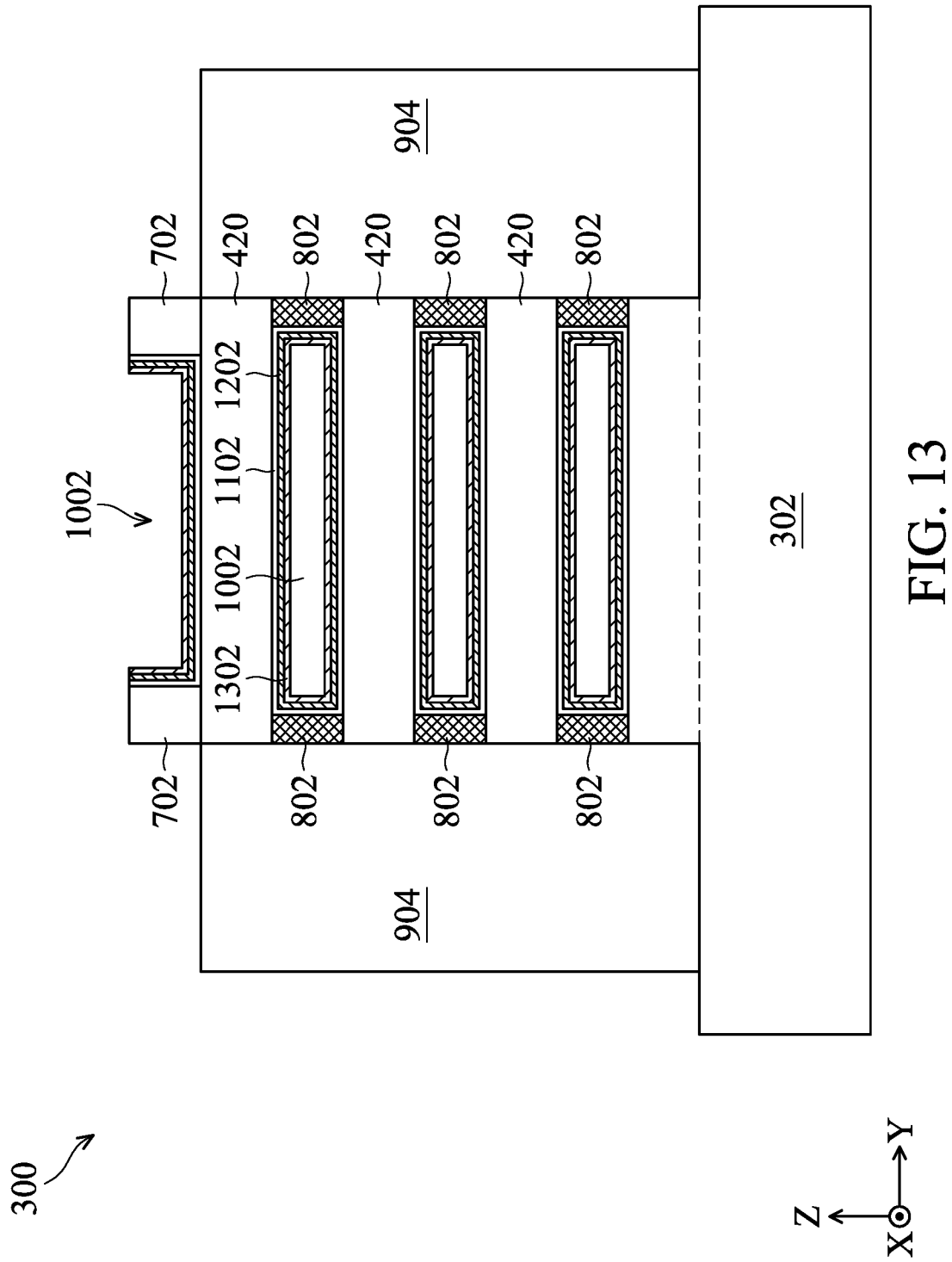

Corresponding to operation 222 of FIG. 2, FIG. 13 is a cross-sectional view of the GAA FET device 300 including a first high-k dielectric layer 1302 formed over the blocking layer 1202, at one of the various stages of fabrication. The cross-sectional view of FIG. 13 is cut in the lengthwise direction of a stack structure of the GAA FET device 300 (e.g., cross-section B-B indicated in FIG. 1).

As shown in the cross-sectional view of FIG. 13, the first high-k dielectric layer 1302 is formed within each portion of the gate trench 1002. Specifically, the first high-k dielectric layer 1302 may wrap around the blocking layer 1202, i.e., further wrapping around the circumference of each of the nanostructures 420. The first high-k dielectric layer 1302 may have a k value greater than about 7.0, and may include a metal oxide or a silicate of Hf, Al, Zr, La, Mg, Ba, Ti, Pb, or combinations thereof. The formation methods of first high-k dielectric layer 1302 may include molecular beam deposition (MBD), atomic layer deposition (ALD), PECVD, and the like. In some embodiments, the first high-k dielectric layer 1302 may be modified (e.g., doped) through an interface dipole engineering so as to adjust the flat band voltage of a corresponding active (e.g., metal) gate structure. Different flat band voltages can correspond to different threshold voltages. In this way, a plural number of transistors having respectively different threshold voltages can be formed through such an adjustment on the flat band voltage, which will be discussed below.

Figure 14:
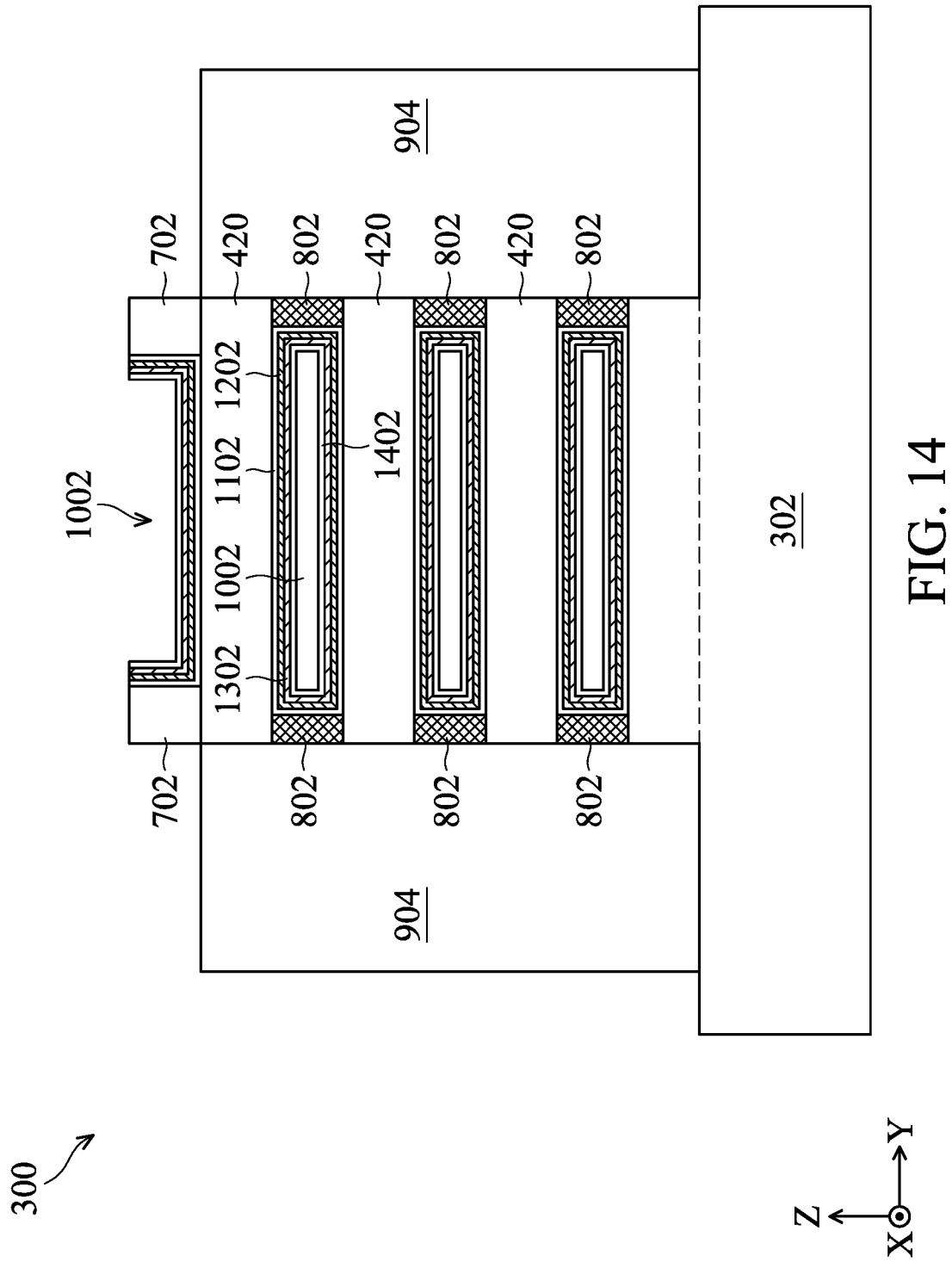

Corresponding to operation 224 of FIG. 2, FIG. 14 is a cross-sectional view of the GAA FET device 300 including one or more threshold voltage modulation layers 1402 formed over the first high-k dielectric layer 1302, at one of the various stages of fabrication. The cross-sectional view of FIG. 14 is cut in the lengthwise direction of a stack structure of the GAA FET device 300 (e.g., cross-section B-B indicated in FIG. 1).

In some embodiments, the threshold voltage modulation layer 1402 may include a dielectric material selected from the group consisting of: lanthanum (III) oxide ($La_2O_3$), lutetium oxide (LuO), scandium oxide (ScO), yttrium oxide ($Y_2O_3$), Thulium (III) oxide ($Tm_2O_3$), gadolinium (III) oxide ($Gd_2O_3$), zinc oxide (ZnO), germanium oxide (GeO), aluminum (II) oxide (AlO), titanium (II) oxide (TiO), vanadium (II) oxide (VO), and combinations thereof. The formation methods of threshold voltage modulation layer 1402 may include molecular beam deposition (MBD), atomic layer deposition (ALD), PECVD, and the like. The threshold voltage modulation layer 1402, upon being annealed, may induce a dipole-interface between itself and the underlying first high-k dielectric layer 1302, which can change the flat band voltage of a corresponding active gate structure that utilizes the first high-k dielectric layer 1302 as a part of its gate dielectric layer. As such, the active gate structures of different conductive types may be formed based on respectively different threshold voltage modulation layers (thus different compositions of the first high-k dielectric layer). For example, lanthanum (III) oxide ($La_2O_3$), lutetium oxide (LuO), scandium oxide (ScO), yttrium oxide ($Y_2O_3$), Thulium (III) oxide ($Tm_2O_3$), gadolinium (III) oxide ($Gd_2O_3$), or combinations thereof may be utilized to form an n-type transistor, while zinc oxide (ZnO), germanium oxide (GeO), aluminum (II) oxide (AlO), titanium (II) oxide (TiO), vanadium (II) oxide (VO), or combinations thereof may be utilized to form a p-type transistor.

Figure 15:
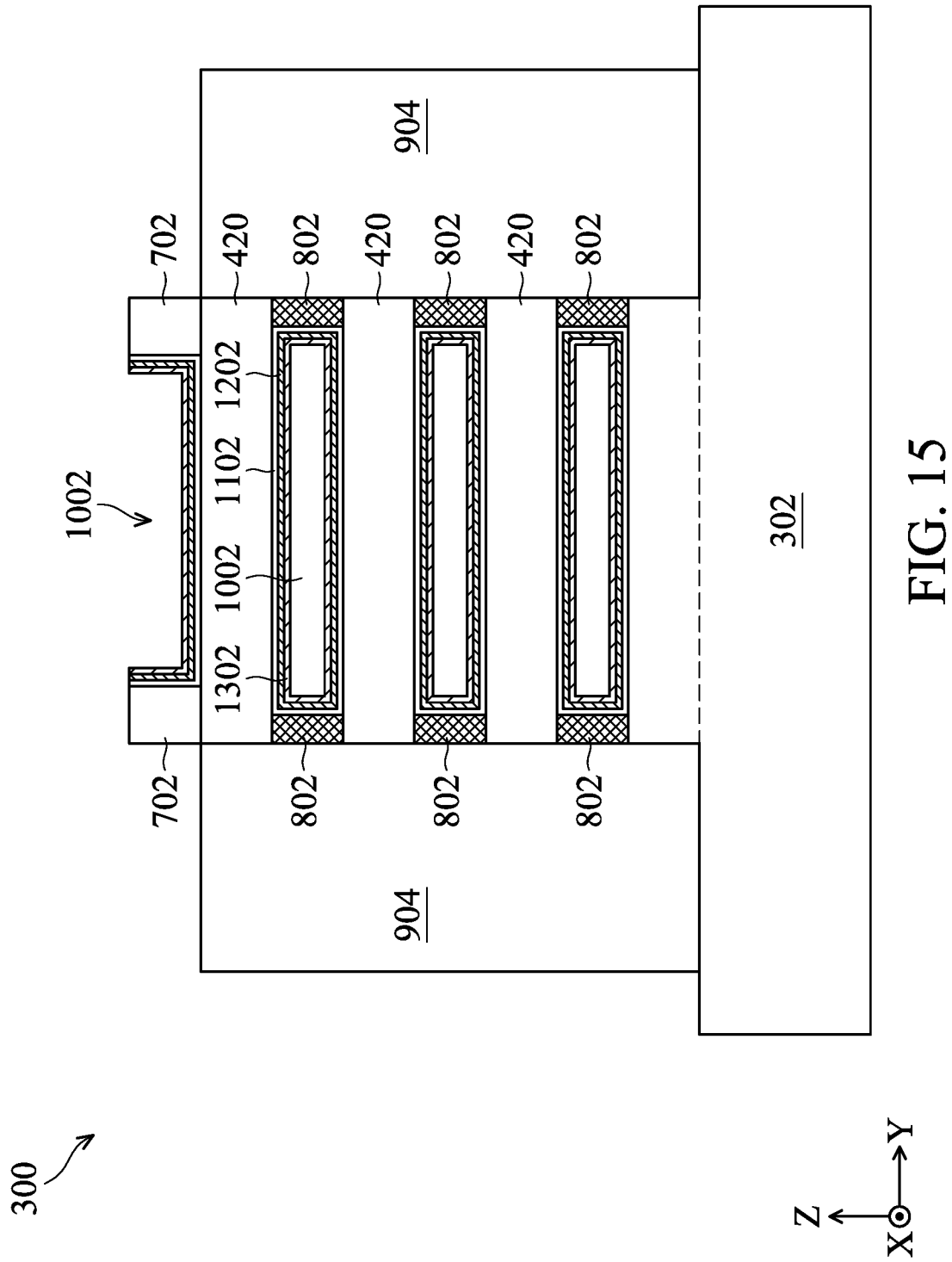

Corresponding to operation 226 of FIG. 2, FIG. 15 is a cross-sectional view of the GAA FET device 300 in which an annealing process is performed, followed by removing the one or more threshold voltage modulation layers 1402, at one or more of the various stages of fabrication. The cross-sectional view of FIG. 15 is cut in the lengthwise direction of a stack structure of the GAA FET device 300 (e.g., cross-section B-B indicated in FIG. 1).

As mentioned above, the annealing process can cause a dipole-interface to be formed between itself and the underlying first high-k dielectric layer 1302. Specifically, through the annealing process, a number of dipoles can be formed along the surface of the first high-k dielectric layer 1302 (i.e., the interface between the first high-k dielectric layer 1302 and the threshold voltage modulation layer 1402). The annealing process may be performed around about 500° C. and 700° C. for about 10 to 30 seconds. After the first high-k dielectric layer 1302 being modified (hereinafter "modified first high-k dielectric layer 1302"), the one or more threshold voltage modulation layer 1402 may be removed through a wet etching process.

Figure 16:
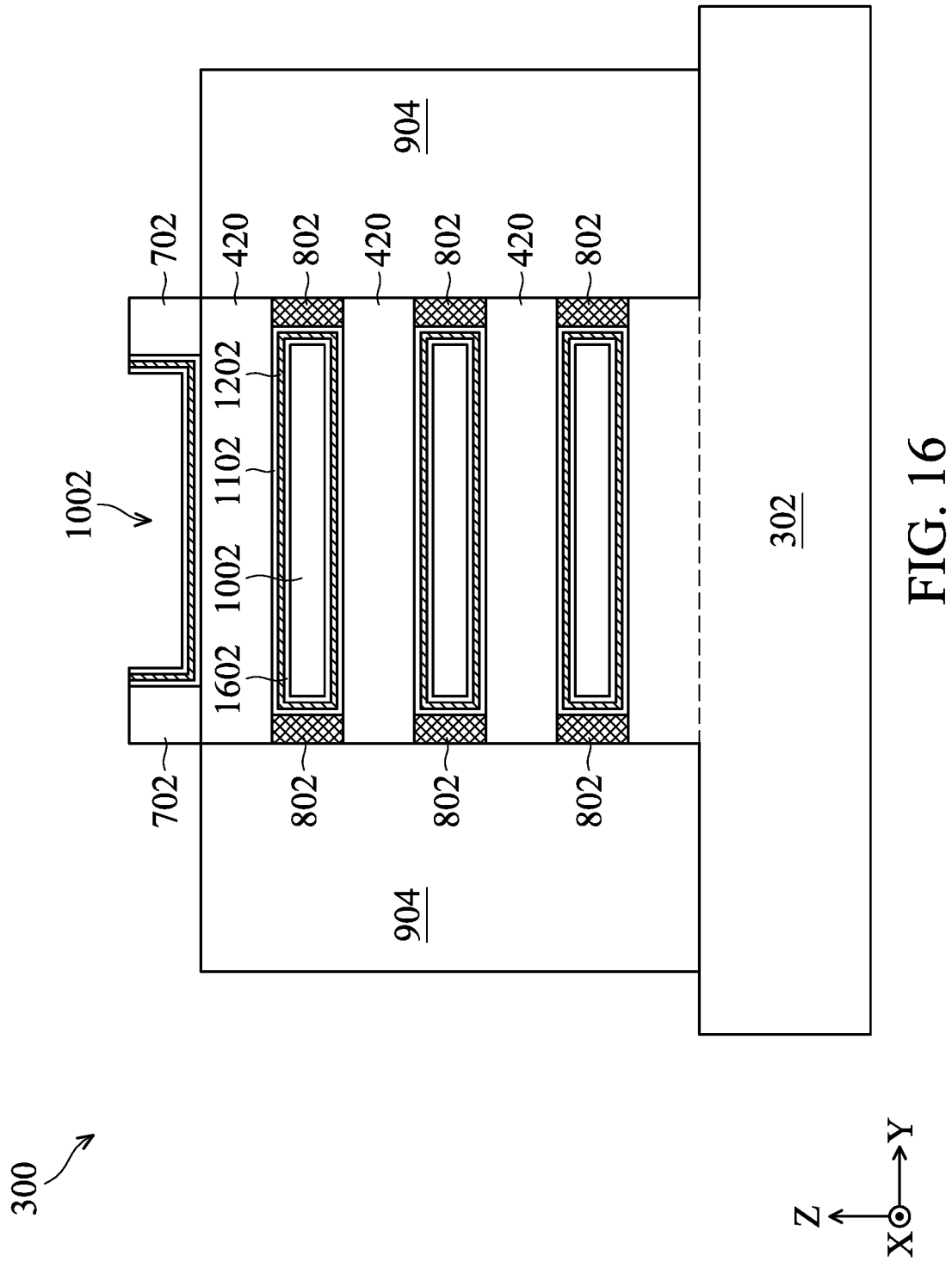

Corresponding to operation 228 of FIG. 2, FIG. 16 is a cross-sectional view of the GAA FET device 300 including a second high-k dielectric layer 1602 formed over the modified first high-k dielectric layer 1302, at one of the various stages of fabrication. The cross-sectional view of FIG. 16 is cut in the lengthwise direction of a stack structure of the GAA FET device 300 (e.g., cross-section B-B indicated in FIG. 1).

As shown in the cross-sectional view of FIG. 16, the second high-k dielectric layer 1602 is formed within each portion of the gate trench 1002. Specifically, the second high-k dielectric layer 1602 may wrap around the modified first high-k dielectric layer 1302, i.e., further wrapping around the circumference of each of the nanostructures 420. The second high-k dielectric layer 1602 may have a k value greater than about 7.0, and may include a metal oxide or a silicate of Hf, Al, Zr, La, Mg, Ba, Ti, Pb, or combinations thereof. The formation methods of second high-k dielectric layer 1602 may include molecular beam deposition (MBD), atomic layer deposition (ALD), PECVD, and the like.

Figure 17:
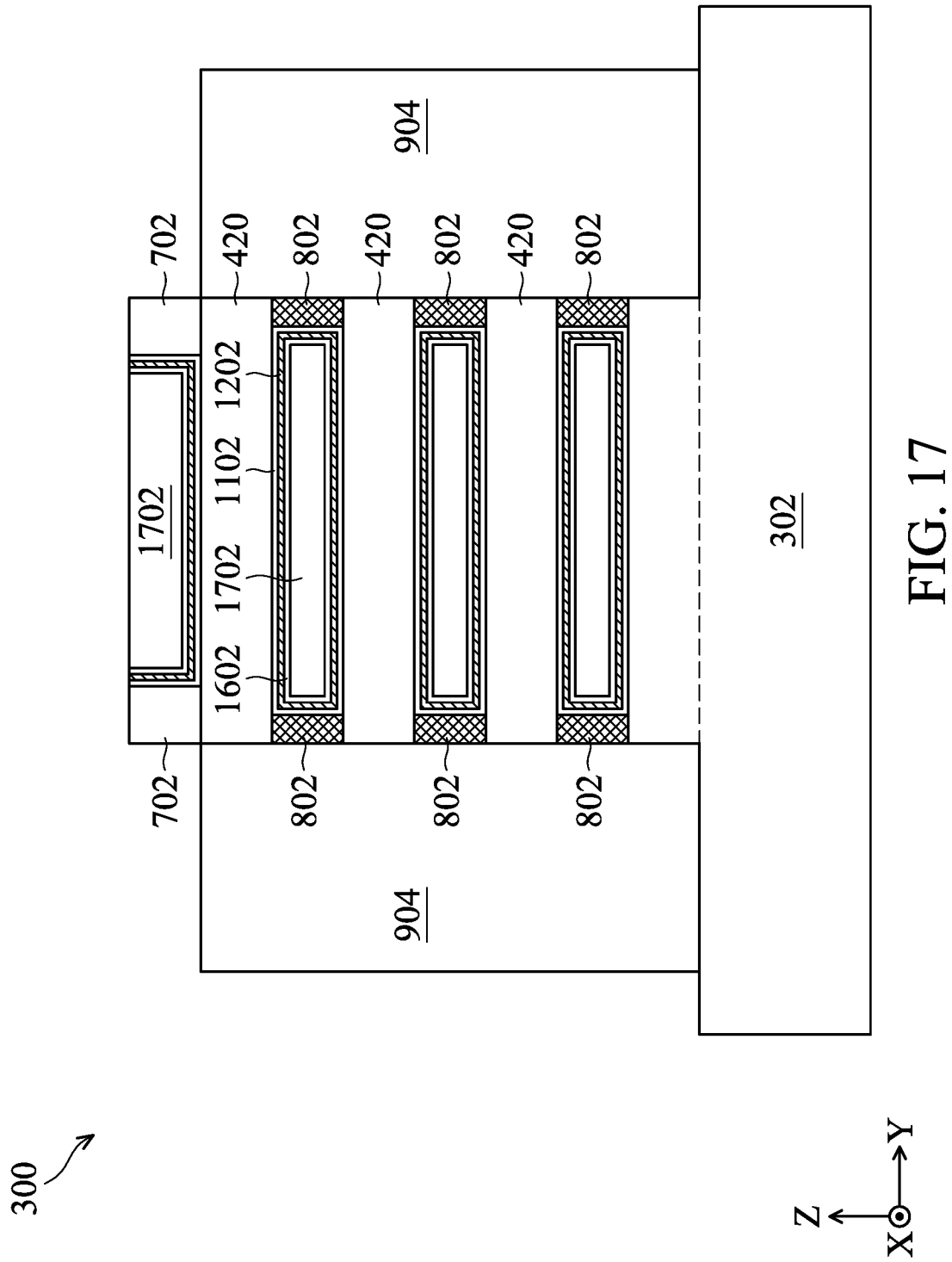

Corresponding to operation 230 of FIG. 2, FIG. 17 is a cross-sectional view of the GAA FET device 300 including one or more work function metal layers 1702 formed over the second high-k dielectric layer 1602, at one of the various stages of fabrication. The cross-sectional view of FIG. 17 is cut in the lengthwise direction of a stack structure of the GAA FET device 300 (e.g., cross-section B-B indicated in FIG. 1).

In some embodiments, the one or more work function metal layers 1702 can be formed over the second high-k dielectric layer 1602 to fill the gate trench 1002, as shown in FIG. 17. The work-function layer can have be or include, for example, TiN, TaN, W, Mo, MON, or the like. In some embodiments, the electron work function of a single work function metal can be about 4.65 eV (e.g., between about 4.6 eV and 4.7 eV). The interfacial layer 1102, the blocking layer 1202, the modified first high-k dielectric layer 1302, the second high-k dielectric layer 1602, and the work function metal layers 1702 may be collectively referred to as an active (e.g., metal) gate structure of the GAA FET device 300. Such an active gate structure can wrap around each of the nanostructures 420, in which the nanostructures 420 can collectively function as a conduction channel of the GAA FET device 300 with epitaxial structures 904 functioning as a source and a drain of the GAA FET device 300.

The work function metal layers 1702 may include a p-type work function layer, an n-type work function layer, multi-layers thereof, or combinations thereof. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function metal layer(s) 1702 may be deposited by CVD, physical vapor deposition (PVD), ALD, and/or other suitable process.

According to various embodiments of the present disclosure, each operation of the method 200 can be concurrently performed on various areas of a substrate to fabricate a plural number of transistors (e.g., GAA FET devices 300) that have respectively different threshold voltages. FIGS. 18, 19, 20, 21, 22, 23, 24, 25, 26, 27, 28, 29, 30 and 31 illustrate a number of fabrication stages to form six different transistors, one or more of which may correspond to operation of the method 200. In the following discussion, these six transistors (from the left to the right) are herein referred to as "transistor A," "transistor B," "transistor C," "transistor D," "transistor E," and "transistor F," respectively.

Figure 18:
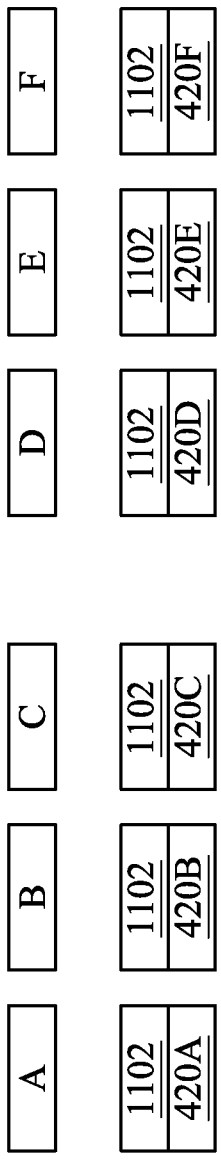
Figure 19:
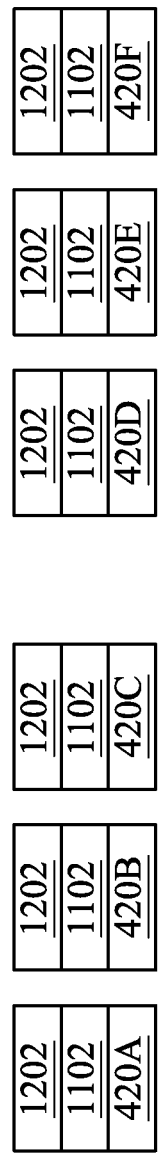
Figure 20:
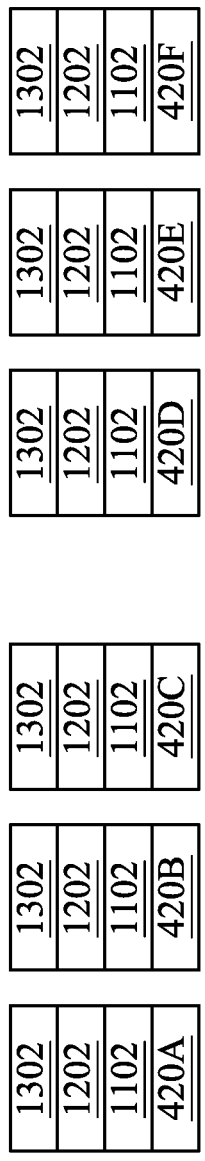

In FIG. 18, after forming the gate trench for each of the transistors A to F (i.e., exposing their respective nanostructures 420A, 420B, 420C, 420D, 420E, and 420F), an interfacial layer 1102 may be universally formed over the transistors A to F to wrap around each of their respective nanostructures 420A to 420F (corresponding to operation 216). Next in FIG. 19, which may correspond to operation 218, a blocking layer 1202 may be universally formed over the transistors A to F. With continued reference to FIG. 19, the various transistors can be annealed (corresponding to operation 220). In FIG. 20, which may correspond to operation 222 a first high-k dielectric layer 1302 may be universally formed over the transistors A to F.

Figures 21, 22:
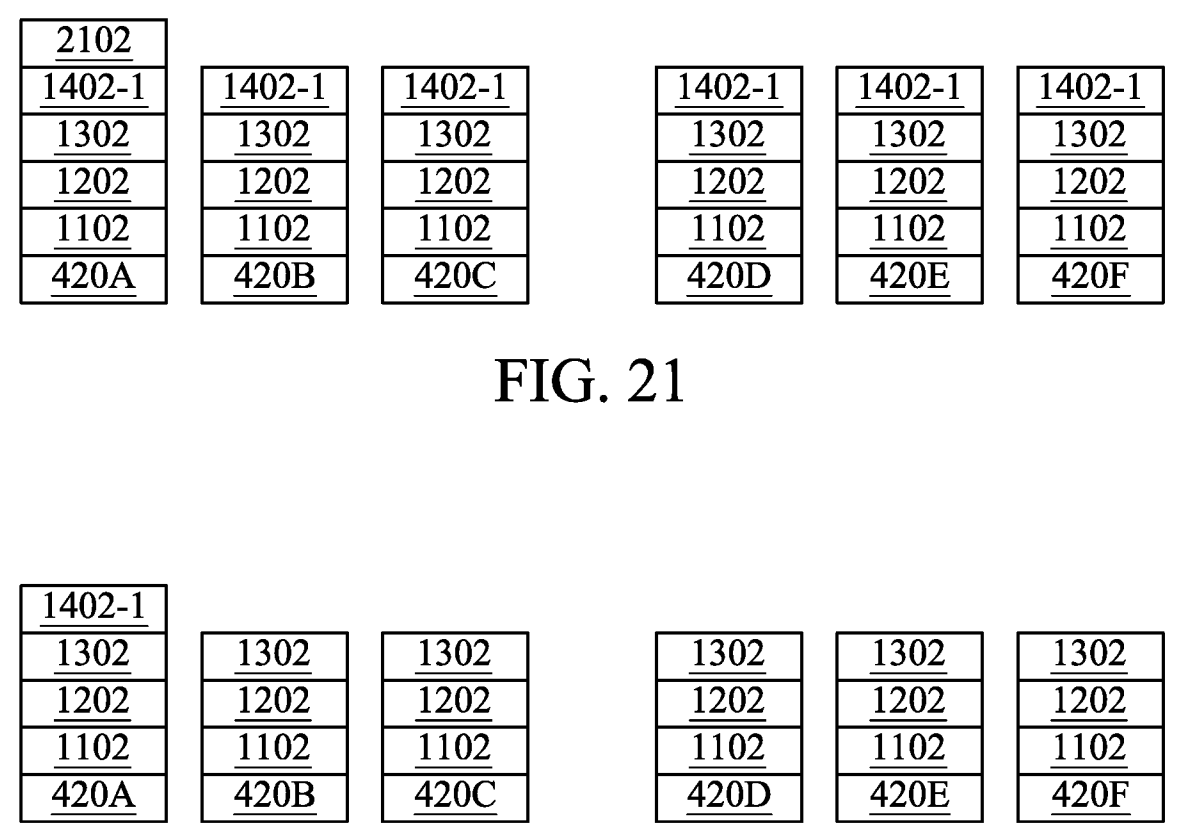
Figures 23, 24:
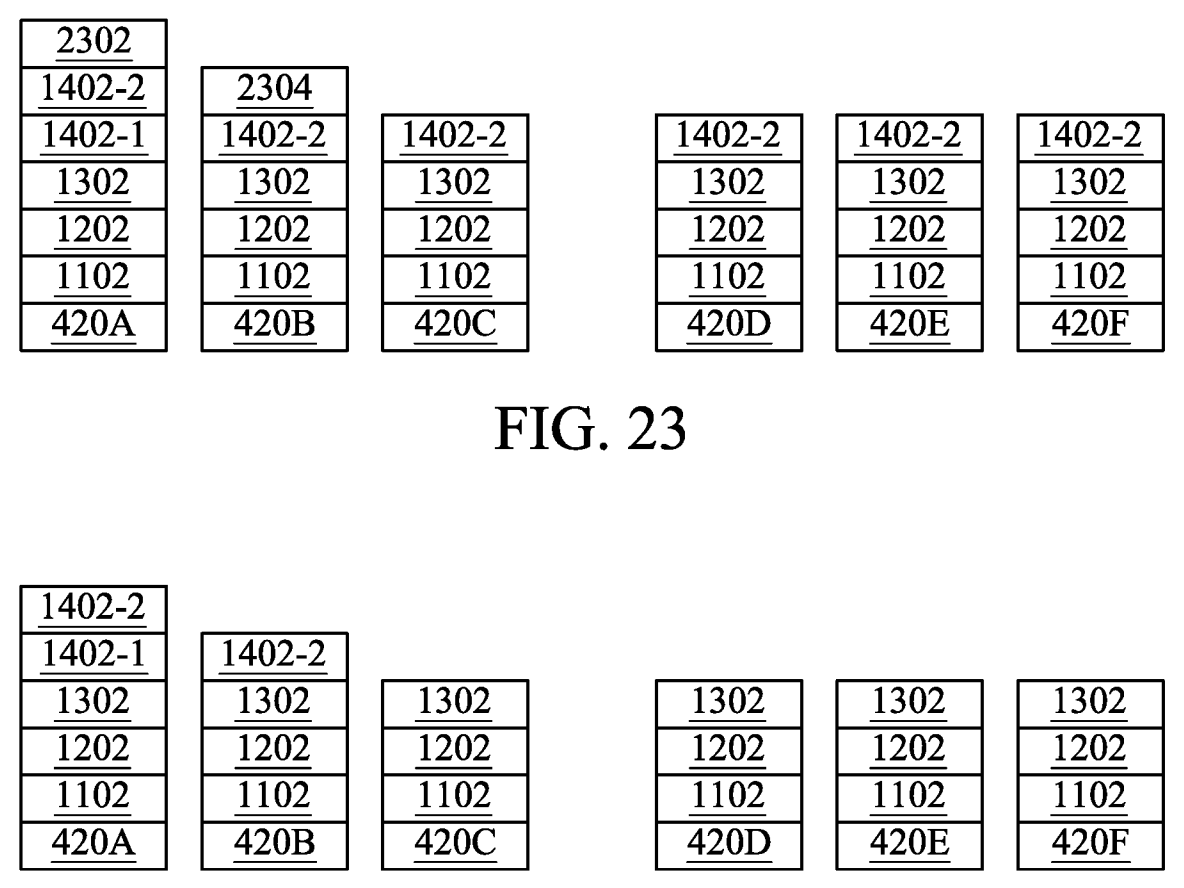

Next in FIG. 21, which may correspond to operation 224, a first voltage threshold modulation layer 1402-1 may be universally formed over the transistors A to F. In some embodiments, the first voltage threshold modulation layer 1402-1 may be selected from one of: lanthanum (III) oxide ($La_2O_3$), lutetium oxide (LuO), scandium oxide (ScO), yttrium oxide ($Y_2O_3$), Thulium (III) oxide ($Tm_2O_3$), gadolinium (III) oxide ($Gd_2O_3$), and combinations thereof. Following the universal formation of the first voltage threshold modulation layer 1402-1, a patterned layer 2102 may be formed to mask the transistor A, with the first voltage threshold modulation layers 1402-1 formed over the transistors B to F being exposed. Accordingly next in FIG. 22 where the exposed first voltage threshold modulation layers 1402-1 are removed, and the patterned layer 2102 is thereafter removed by a process which his selective with regard to the threshold voltage modulation layers 1402, only the first high-k dielectric layer 1302 of the transistor A is wrapped by the first voltage threshold modulation layer 1402-1. Next in FIG. 23, a second voltage threshold modulation layer 1402-2 may be universally formed over the transistors A to F. In some embodiments, the second voltage threshold modulation layer 1402-2 may be selected from one of: lanthanum (III) oxide ($La_2O_3$), lutetium oxide (LuO), scandium oxide (ScO), yttrium oxide ($Y_2O_3$), Thulium (III) oxide ($Tm_2O_3$), gadolinium (III) oxide ($Gd_2O_3$), and combinations thereof. Following the universal formation of the second voltage threshold modulation layer 1402-2, patterned layers 2302 and 2304 may be formed to mask the transistor A and transistor B, respectively, with the second voltage threshold modulation layers 1402-2 formed over the transistors C to F being exposed. The patterned layers 2302, 2304 may be a same material added by a same process over the surface of the GAA FET device 300. Next, in FIG. 24 where the patterned layers 2302, 2304 are removed subsequent to the exposed second voltage threshold modulation layers 1402-2, only the first high-k dielectric layer 1302 of the transistor A is wrapped by the first voltage threshold modulation layer 1402-1 and second voltage threshold modulation layer 1402-2, and only the first high-k dielectric layer 1302 of the transistor B is wrapped by the second voltage threshold modulation layer 1402-2.

Figures 25, 26:
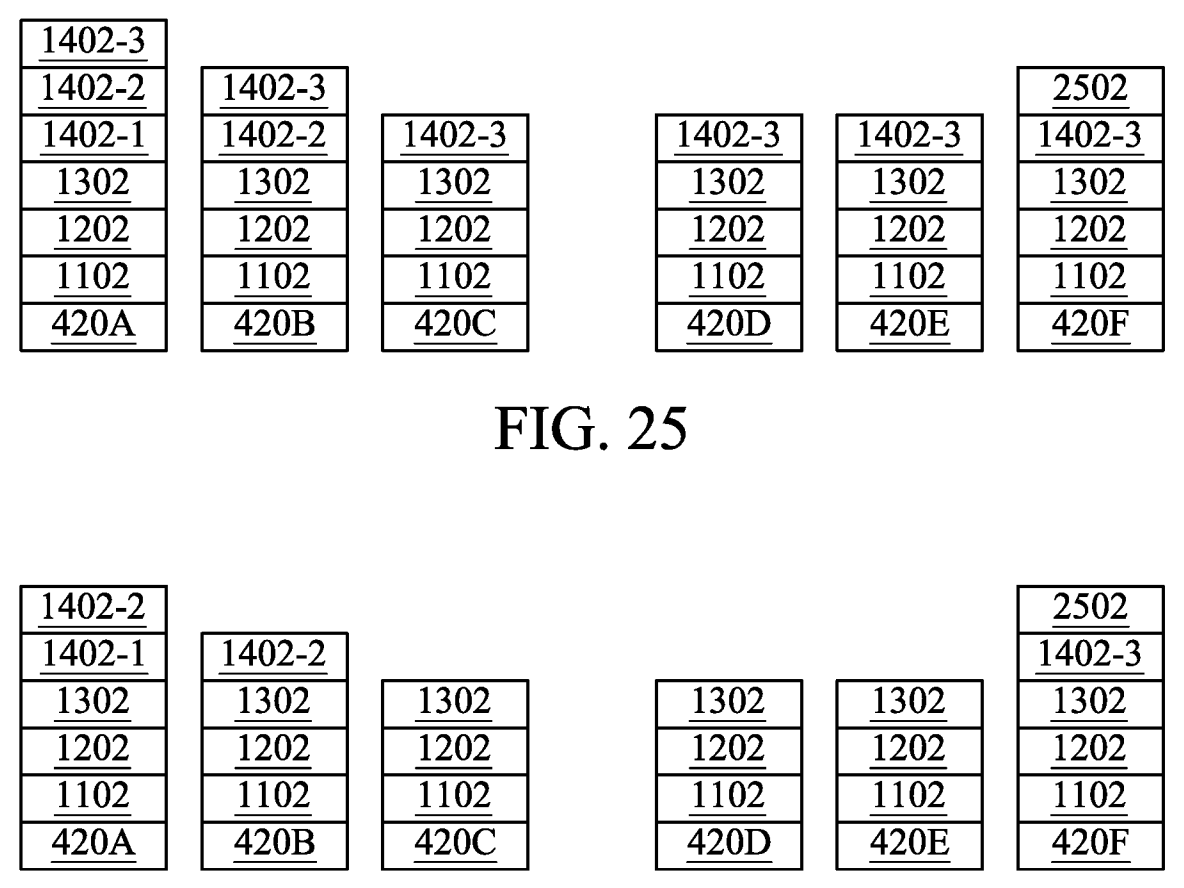
Figures 27, 28:
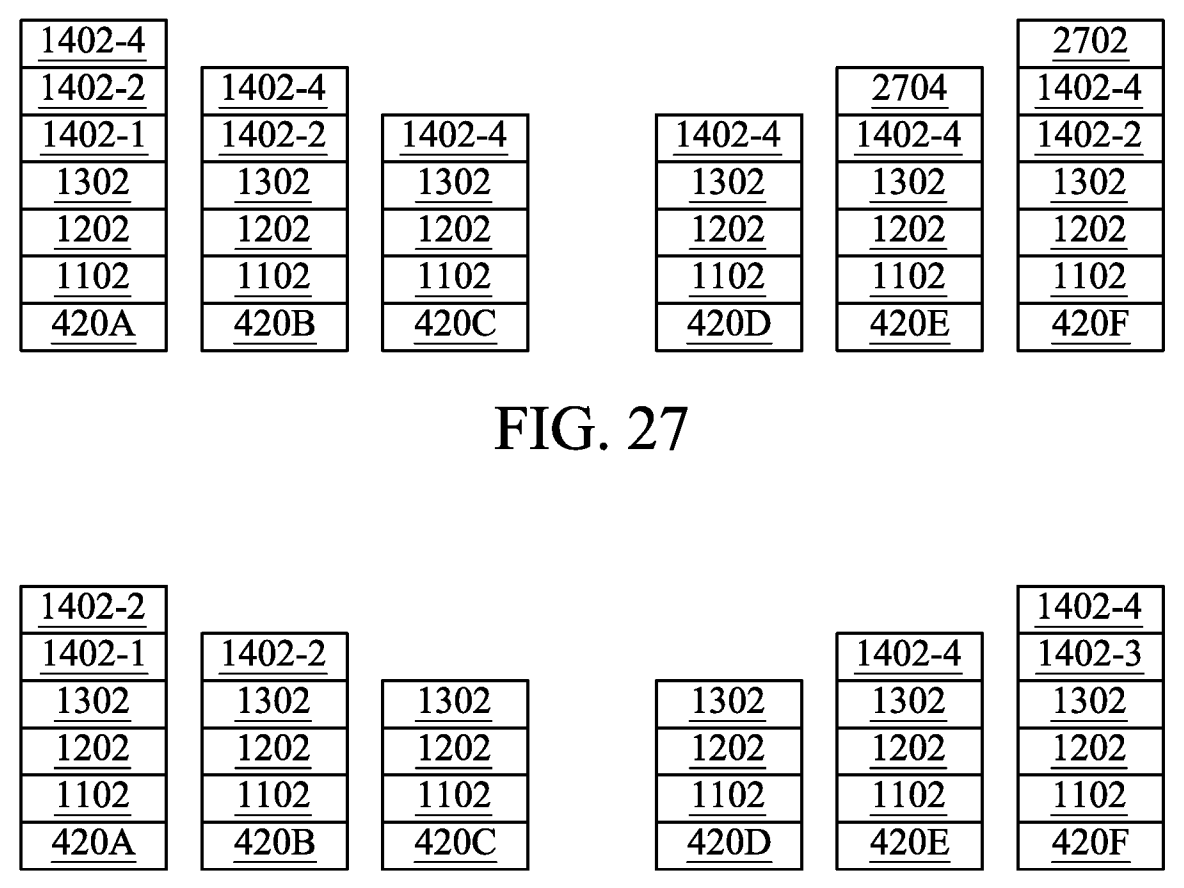

Next in FIG. 25, which may still correspond to operation 224, a third voltage threshold modulation layer 1402-3 may be universally formed over the transistors A to F. In some embodiments, the third voltage threshold modulation layer 1402-3 may be selected from one of: zinc oxide (ZnO), germanium oxide (GeO), aluminum (II) oxide (AlO), titanium (II) oxide (TiO), vanadium (II) oxide (VO), or combinations thereof. Following the universal formation of the third voltage threshold modulation layer 1402-3, a patterned layer 2502 may be formed to mask the transistor F, with the third voltage threshold modulation layers 1402-3 formed over the transistors A to E being exposed. Accordingly, next in FIG. 26, where the exposed third voltage threshold modulation layers 1402-3 are removed (e.g., by an etch or other process which is selective to 1402-3, with regard to 1402-2), only the first high-k dielectric layer 1302 of the transistor F is wrapped by the third voltage threshold modulation layer 1402-3. Here, the patterned layer 2502 is depicted subsequent to the removal of the third voltage threshold modulation layers 1402-3. The patterned layer 2502 can be removed prior to the formation of further voltage threshold modulation layers 1402, such as the fourth voltage threshold modulation layer 1402-4 universally formed over the transistors A to F as depicted in FIG. 27. In some embodiments, the fourth voltage threshold modulation layer 1402-4 may be selected from one of: zinc oxide (ZnO), germanium oxide (GeO), aluminum (II) oxide (AlO), titanium (II) oxide (TiO), vanadium (II) oxide (VO), or combinations thereof. Following the universal formation of the fourth voltage threshold modulation layer 1402-4, patterned layers 2702 and 2704 may be formed to mask the transistor F and transistor E, respectively, with the fourth voltage threshold modulation layers 1402-4 formed over the transistors A to D being exposed. As previously described with regard to patterned layers (e.g., photoresists) 2702 and 2704, the patterned layers 2702 and 2704 may be a layer deposited over a surface of the semiconductor device along a lateral surface thereof. In FIG. 28, where the exposed fourth voltage threshold modulation layers 1402-4 are removed, only the first high-k dielectric layer 1302 of the transistor F is wrapped by the third voltage threshold modulation layer 1402-3 and fourth voltage threshold modulation layer 1402-4, and only the first high-k dielectric layer 1302 of the transistor E is wrapped by the fourth voltage threshold modulation layer 1402-4.

Figure 29:
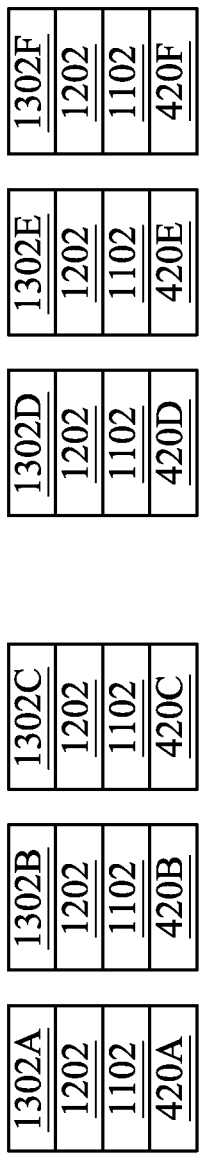

Next in FIG. 29, which may correspond to operation 226, an annealing process is performed to modify the first high-k dielectric layers 1302 of the transistors A to F, respectively, as discussed above. It is sometimes referred to as driving different dopants or different amounts of dopants into the modified first high-k dielectric layers 1302 of the transistors A to F, which are herein referred to as "first high-k dielectric layers 1302A," which can include an N-type dopant, "first high-k dielectric layers 1302B," which can include an N-type dopant of lesser concentration than first high-k dielectric layers 1302A, "first high-k dielectric layers 1302C," "first high-k dielectric layers 1302D," "first high-k dielectric layers 1302E," which can include a P-type dopant, and "first high-k dielectric layers 1302F," which can include a P-type dopant of greater concentration than first high-k dielectric layers 1302E, respectively. After the drive-in process, the "remaining" threshold voltage modulation layers may be removed from the transistors, e.g., A, B, E, and F. Additional or fewer operations can be performed to differently dope the various high-k dielectric layers.

Figures 30, 31:
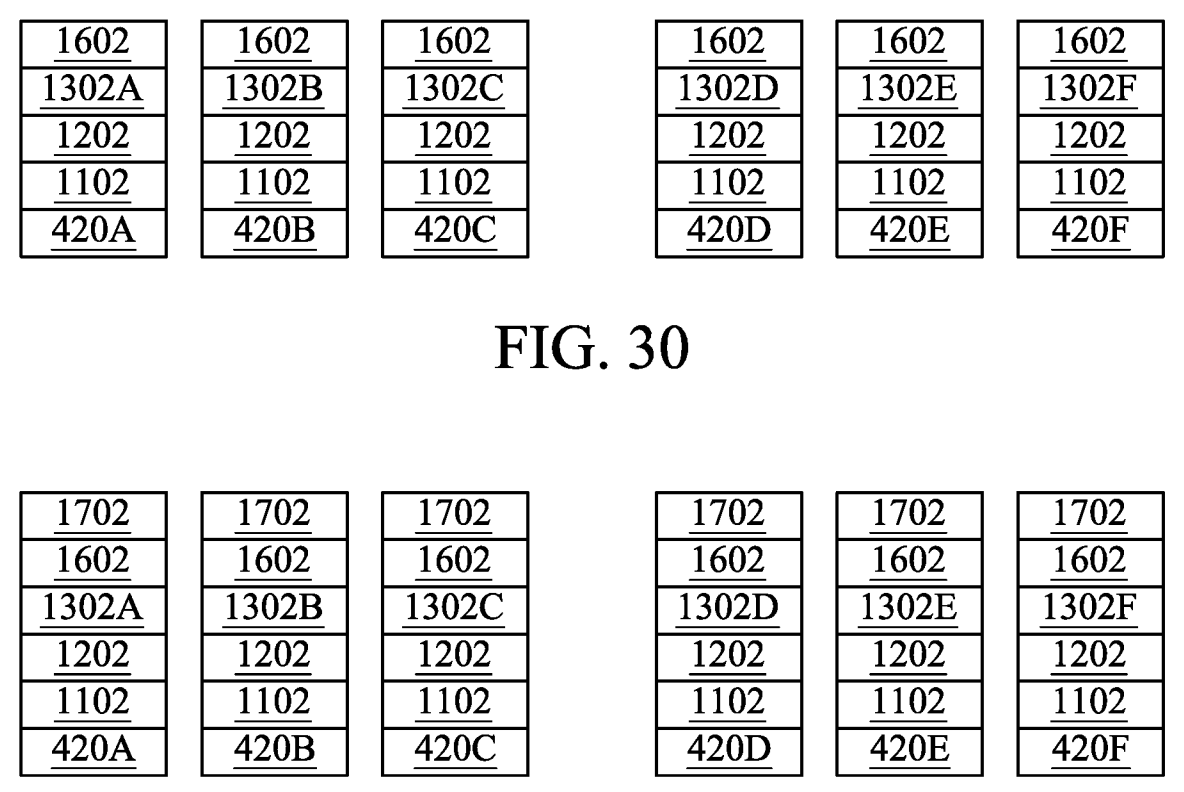

Next in FIG. 30, which may correspond to operation 228, a second high-k dielectric layer 1602 may be universally formed over the transistors A to F. As such, each of the first high-k dielectric layers 1302A to 1302F may be wrapped by the universally formed second high-k dielectric layer 1602. Next in FIG. 31, which may correspond to operation 230, a work function metal layer 1702 may be universally formed over the transistors A to F. Even though the work function metal layer 1702 is universally formed over the transistors A to F, with their first high-k dielectric layers 1302A to 1302F being modified differently, the transistors A to F can still have respective different threshold voltages (e.g., the transistors can be tuned by the deposition of voltage threshold modulation layers 1402 and subsequent annealing time, temperature, ramp, or the like).

In one aspect of the present disclosure, a method for fabricating a semiconductor device is disclosed. The method includes exposing one or more surfaces of a conduction channel of a transistor; overlaying the one or more surfaces with a dielectric interfacial layer; overlaying the dielectric interfacial layer with a blocking layer; performing a first annealing process to densify the dielectric interfacial layer; overlaying the blocking layer with a first high-k dielectric layer; forming one or more threshold voltage modulation layers over the first high-k dielectric layer; performing a second annealing process to adjust a doping profile of the first high-k dielectric layer; and overlaying the first high-k dielectric layer with a second high-k dielectric layer.

In another aspect of the present disclosure, a method for fabricating a semiconductor device is disclosed. The method includes exposing one or more surfaces of a first conduction channel of a first transistor; exposing one or more surfaces of a second conduction channel of a second transistor; universally overlaying the one or more surfaces of the first conduction channel and the one or more surfaces of the second conduction channel with a dielectric interfacial layer; universally overlaying the one or more surfaces of the first conduction channel and the one or more surfaces of the second conduction channel with a blocking layer; performing a first annealing process; overlaying the blocking layer around the first conduction channel with a first high-k dielectric layer and the blocking layer around the second conduction channel with a second high-k dielectric layer, respectively; forming a first combination of threshold voltage modulation layers over the first high-k dielectric layer; forming a second combination of threshold voltage modulation layers over the second high-k dielectric layer; performing a second annealing process on at least the first combination of threshold voltage modulation layers and the second combination of threshold voltage modulation layers; removing the first combination of threshold voltage modulation layers and the second combination of threshold voltage modulation layers; and overlaying the first high-k dielectric layer with a third high-k dielectric layer and the second high-k dielectric layer with a fourth high-k dielectric layer, respectively.

In yet another aspect of the present disclosure, a method for fabricating a semiconductor device is disclosed. The method includes exposing a circumference of each of a plurality of nanostructures, wherein, wherein the plurality of nanostructures are vertically spaced from one another; wrapping around the circumferences with a dielectric interfacial layer; wrapping around the dielectric interfacial layer with a blocking layer; densifying the dielectric interfacial layer through an annealing process; wrapping around the blocking layer with a first high-k dielectric layer; wrapping around the first high-k dielectric layer with one or more threshold voltage modulation layers; adjusting a doping profile of the first high-k dielectric layer through another annealing process; removing the one or more threshold voltage modulation layers; wrapping around the first high-k dielectric layer with a second high-k dielectric layer; and wrapping around the second high-k dielectric layer with one or more work function metal layers.

As used herein, the terms "about" and "approximately" generally mean plus or minus a certain percentage of the stated value, depending on a technology node applied to the present disclosure. For example, the percentage may be equal to 10%, such that about 0.5 would include 0.45 and 0.55, about 10 would include 9 to 11, about 1000 would include 900 to 1100, and so on. In another example, the percentage may be equal to 20%, such that about 0.5 would include 0.4 and 0.6, about 10 would include 8 to 12, about 1000 would include 800 to 1200, and so on. In yet another example, the percentage may be equal to 30%, such that about 0.5 would include 0.35 and 0.65, about 10 would include 7 to 13, about 1000 would include 700 to 1300, and so on.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    exposing one or more surfaces of a conduction channel of a transistor;
    overlaying the one or more surfaces with a dielectric interfacial layer;
    overlaying the dielectric interfacial layer with a blocking layer;
    performing a first annealing process to densify the dielectric interfacial layer;
    overlaying the blocking layer with a first high-k dielectric layer;
    forming one or more threshold voltage modulation layers over the first high-k dielectric layer;
    performing a second annealing process to adjust a doping profile of the first high-k dielectric layer; and
    overlaying the first high-k dielectric layer with a second high-k dielectric layer.

2. The method of claim 1, wherein the blocking layer includes a high-k dielectric material selected from a group consisting of: aluminum oxide ($Al_2O_3$), scandium oxide ($ScO_2$), yttrium oxide ($Y_2O_3$), lutetium(III) oxide ($Lu_2O_3$), thulium(III) oxide ($Tm_2O_3$), gadolinium(III) oxide ($Gd_2O_3$), erbium(III) oxide ($Er_2O_3$), magnesium oxide (MgO), calcium oxide (CaO), zirconium silicate ($ZrSiO_4$).

3. The method of claim 1, wherein the blocking layer is configured to prevent oxygen from reaching the dielectric interfacial layer, thereby maintaining an originally formed thickness of the dielectric interfacial layer.

4. The method of claim 1, wherein the dielectric interfacial layer has a first dielectric constant and the blocking layer has a second dielectric constant, the second dielectric constant being greater than the first dielectric constant.

5. The method of claim 1, further comprising performing a wet etching process to form the dielectric interfacial layer, wherein the wet etching process includes applying a heated chemical mixture on the one or more surfaces of the conduction channel, and wherein the chemical mixture includes at least one of: ammonium hydroxide ($NH_4OH$), hydrogen chloride (HCl), sulfuric acid ($H_2SO_4$), or hydrogen peroxide ($H_2O_2$).

6. The method of claim 5, wherein an originally formed thickness of the dielectric interfacial layer is equal to or less than 5 angstroms (Å).

7. The method of claim 1, wherein the conduction channel includes a plurality of nanostructures vertically spaced from one another.

8. The method of claim 1, following the step of performing the second annealing process, further comprising removing the one or more threshold voltage modulation layers.

9. The method of claim 1, wherein the one or more threshold voltage modulation layers are selected from a group consisting of: lanthanum (III) oxide ($La_2O_3$), lutetium oxide (LuO), scandium oxide (ScO), yttrium oxide ($Y_2O_3$), Thulium (III) oxide ($Tm_2O_3$), gadolinium(III) oxide ($Gd_2O_3$), and combinations thereof.

10. The method of claim 1, wherein the one or more threshold voltage modulation layers are selected from a group consisting of: zinc oxide (ZnO), germanium oxide (GeO), aluminum(II) oxide (AlO), titanium(II) oxide (TiO), vanadium(II) oxide (VO), and combinations thereof.

11. The method of claim 1, following the step of overlaying the first high-k dielectric layer with the second high-k dielectric layer, further comprising:
    forming one or more work function metal layers over the second high-k dielectric layer; and
    forming an interconnect structure in contact with at least a portion of the one or more work function metal layers.

12. A method for fabricating a gate all around transistor, comprising:
    forming a plurality of conduction channels between a source region and a drain region;
    overlaying the conduction channels with a dielectric interfacial layer;
    overlaying the dielectric interfacial layer with a barrier dielectric configured to prevent oxygen from reaching the dielectric interfacial layer;
    densifying the dielectric interfacial layer at a first annealing temperature below a recrystallization temperature of the barrier dielectric;
    overlaying the barrier dielectric with a high-k dielectric layer;
    forming a threshold voltage modulation layer over the high-k dielectric layer;
    performing an annealing process to adjust a doping profile of the high-k dielectric layer; and
    removing the threshold voltage modulation layer subsequent to the annealing process.

13. The method of claim 12, further comprising:
    overlaying the high-k dielectric layer with a second high-k dielectric layer, subsequent to the removal of the threshold voltage modulation layer.

14. The method of claim 12, wherein the barrier dielectric layer includes a high-k dielectric material selected from a group consisting of: aluminum oxide ($Al_2O_3$), scandium oxide ($ScO_2$), yttrium oxide ($Y_2O_3$), lutetium(III) oxide ($Lu_2O_3$), thulium(III) oxide ($Tm_2O_3$), gadolinium(III) oxide ($Gd_2O_3$), erbium(III) oxide ($Er_2O_3$), magnesium oxide (MgO), calcium oxide (CaO), zirconium silicate ($ZrSiO_4$).

15. The method of claim 12, wherein the barrier dielectric layer is configured to maintain an originally formed thickness of the dielectric interfacial layer that is equal to or less than 5 angstroms (Å).

16. The method of claim 12, wherein the dielectric interfacial layer has a first dielectric constant and the barrier dielectric layer has a second dielectric constant, the second dielectric constant being greater than the first dielectric constant.

17. The method of claim 12, wherein the plurality of conduction channels comprise nanostructures vertically spaced from one another by a portion of a gate structure.

18. The method of claim 12, wherein:
    the threshold voltage modulation layer comprises materials selected from a group consisting of: lanthanum (III) oxide ($La_2O_3$), lutetium oxide (LuO), scandium oxide (ScO), yttrium oxide ($Y_2O_3$), Thulium(III) oxide ($Tm_2O_3$), gadolinium(III) oxide ($Gd_2O_3$), zinc oxide (ZnO), germanium oxide (GeO), aluminum(II) oxide (AlO), titanium(II) oxide (TiO), vanadium(II) oxide (VO), and combinations thereof.

19. A method for fabricating a transistor, comprising:
    exposing a surface of a conduction channel;
    overlaying the surface with a dielectric interfacial layer;
    overlaying the dielectric interfacial layer with a blocking layer;
    performing a first annealing process to densify the dielectric interfacial layer;
    overlaying the blocking layer with a gate dielectric layer;
    using a threshold voltage modulation layer to adjust a doping profile of the gate dielectric layer; and
    forming a work function metal layer over the gate dielectric layer.

20. The method of claim 19, wherein the gate dielectric layer comprises a plurality of sublayers, including at least one sublayer in contact with the work function metal layer, and further comprising:
    forming an interconnect structure in contact with the work function metal layer.

* * * * *